(12) United States Patent
Sato et al.

(10) Patent No.: US 8,211,733 B2
(45) Date of Patent: Jul. 3, 2012

(54) SOLID-STATE IMAGING DEVICE AND ELECTRONIC DEVICE

(75) Inventors: Maki Sato, Kanagawa (JP); Susumu Ooki, Kanagawa (JP)

(73) Assignee: Sony Corporation, Tokyo (JP)

( * ) Notice: Subject to any disclaimer, the term of this patent is extended or adjusted under 35 U.S.C. 154(b) by 125 days.

(21) Appl. No.: 12/854,627

(22) Filed: Aug. 11, 2010

(65) Prior Publication Data

US 2010/0330724 A1 Dec. 30, 2010

Related U.S. Application Data

(62) Division of application No. 11/862,369, filed on Sep. 27, 2007, now Pat. No. 7,795,655.

(30) Foreign Application Priority Data

Oct. 4, 2006 (JP) .................................. 2006-273254
Oct. 25, 2006 (JP) .................................. 2006-290382

(51) Int. Cl.
*H01L 21/00* (2006.01)
(52) U.S. Cl. .................... 438/60; 257/292; 257/E27.133
(58) Field of Classification Search ................. 438/59, 438/60, 75, 237; 257/291, 292
See application file for complete search history.

(56) References Cited

U.S. PATENT DOCUMENTS

| | | | |
|---|---|---|---|
| 6,184,055 B1 * | 2/2001 | Yang et al. ...................... | 438/57 |
| 6,201,268 B1 | 3/2001 | Nakashiba | |
| 6,894,268 B2 | 5/2005 | Ohkawa | |
| 7,115,924 B1 | 10/2006 | LaMaster et al. | |
| 2003/0136982 A1 | 7/2003 | Rhodes | |
| 2004/0000681 A1 | 1/2004 | Shinohara et al. | |
| 2004/0046193 A1 * | 3/2004 | Park et al. ...................... | 257/292 |
| 2004/0105023 A1 | 6/2004 | Okada | |
| 2004/0217426 A1 | 11/2004 | Lee | |
| 2005/0280046 A1 * | 12/2005 | Shin .............................. | 257/226 |
| 2007/0012966 A1 * | 1/2007 | Park .............................. | 257/291 |
| 2007/0023800 A1 | 2/2007 | Ohkawa | |

FOREIGN PATENT DOCUMENTS

| | | |
|---|---|---|
| JP | 63-046764 | 2/1988 |
| JP | 2000-150847 | 5/2000 |
| JP | 2000-150848 | 5/2000 |
| JP | 2004-104131 | 4/2004 |
| JP | 2004-165479 | 6/2004 |
| JP | 2005-268812 | 9/2005 |
| JP | 2006-024786 | 1/2006 |
| JP | 2006-261355 | 9/2006 |
| WO | 2005/013370 | 2/2005 |

OTHER PUBLICATIONS

Japanese Office Action issued on Mar. 6, 2012, in connection with counterpart JP Application No. 2006-273254.

* cited by examiner

*Primary Examiner* — Kiesha Bryant
*Assistant Examiner* — Mark Tornow
(74) *Attorney, Agent, or Firm* — SNR Denton US LLP

(57) ABSTRACT

A solid-state imaging device including an imaging region having a plurality of pixels arranged in a two-dimensional matrix and a peripheral circuit detecting output signals from the pixels. An impurity concentration in a transistor of each pixel is lower than an impurity concentration in a transistor of the peripheral circuit. Further, the impurity concentration of a semiconductor well region under a floating diffusion portion in the pixel is set to be lower than the impurity concentration of a semiconductor well region under a transistor portion at the subsequent stage of the floating diffusion portion.

3 Claims, 30 Drawing Sheets

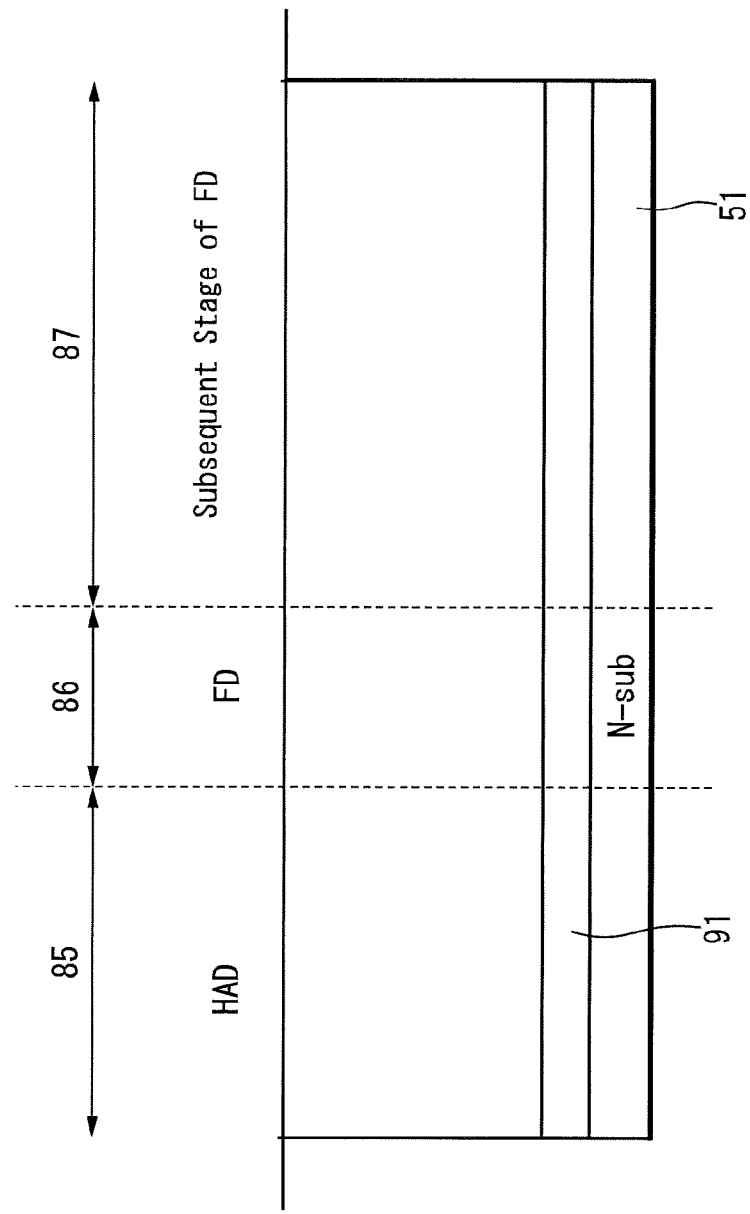
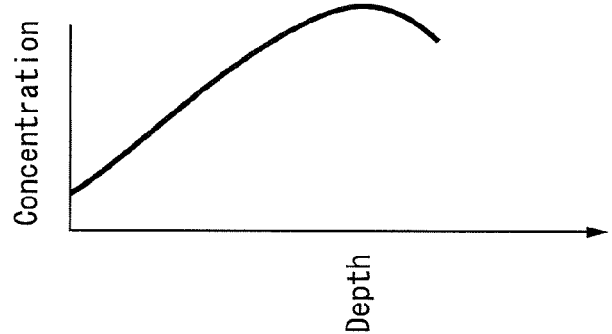

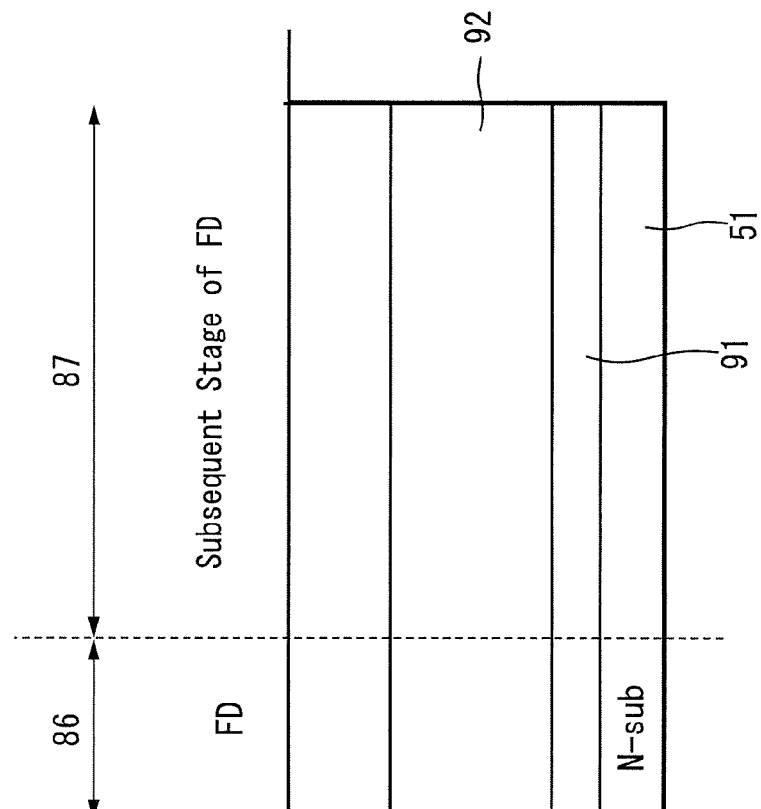
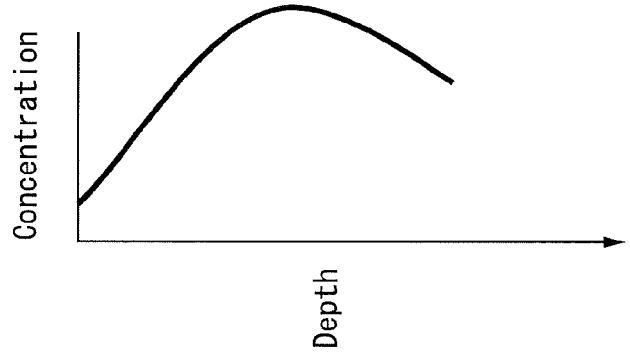

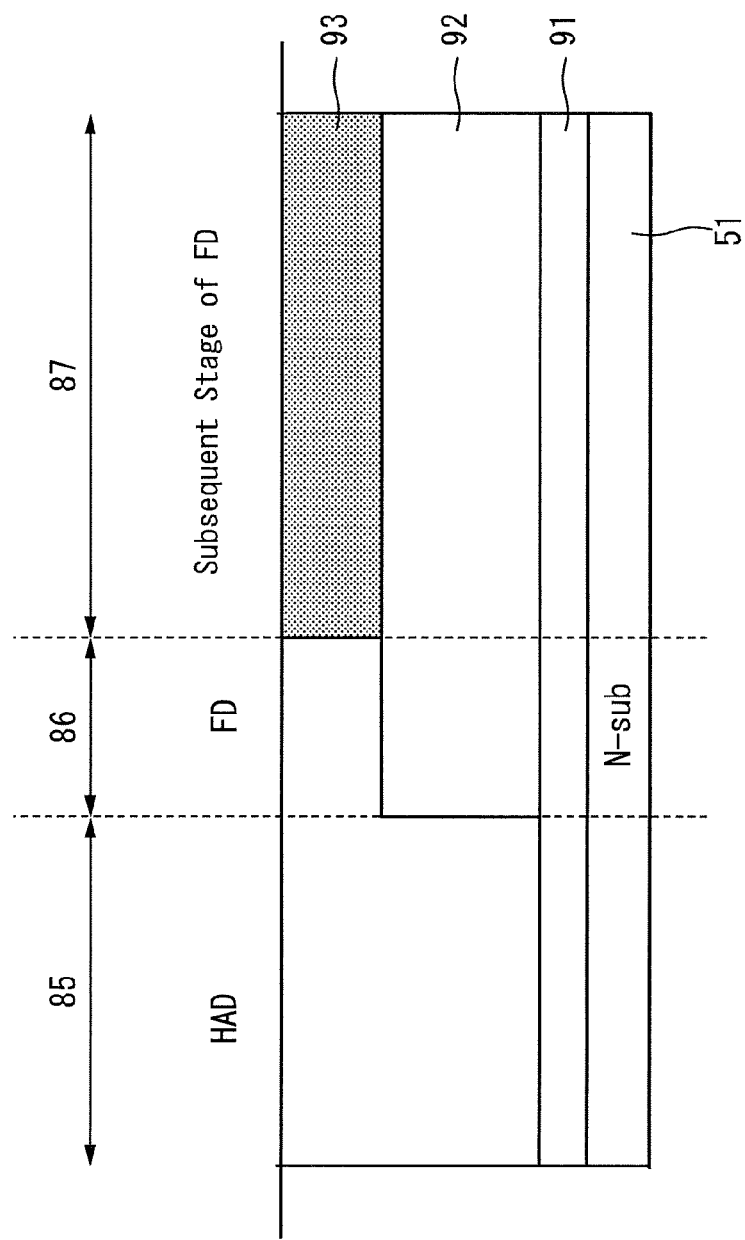
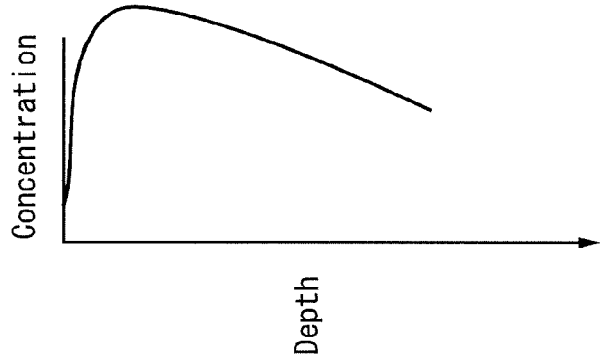

SOLID-STATE IMAGING DEVICE AND ELECTRONIC DEVICE

RELATED APPLICATION DATA

This application is a division of U.S. patent application Ser. No. 11/862,369, filed Sep. 27, 2007, the entirety of which is incorporated herein by reference to the extent permitted by law. The present application claims the benefit of priority to Japanese Patent Application Nos. JP 2006-273254 and JP 2006-290382 filed in the Japanese Patent Office on Oct. 4, 2006 and Oct. 25, 2006, respectively, the entireties of both of which are incorporated by reference herein to the extent permitted by law.

BACKGROUND OF THE INVENTION

1. Field of the Invention

The present invention relates to a solid-state imaging device and an electronic device including the solid-state imaging device.

2. Description of the Related Art

CMOS (Complementary Metal-Oxide-Semiconductor) solid-state imaging devices (CMOS image sensors) are solid-state imaging devices particularly attracting attention in recent years. Such a CMOS solid-state imaging device includes an imaging region having many pixels arranged in a two-dimensional matrix; and a peripheral circuit provided around the imaging region. In the imaging region, each of the pixels has a floating diffusion (FD) layer of converting charges from a photoelectric conversion portion (photodiode: PD) into voltage signals; a transfer transistor of transferring the charges from the photodiode to the floating diffusion portion; a reset transistor of resetting the charges in the floating diffusion portion; and an amplifying transistor of outputting a potential of the floating diffusion portion as a signal level.

A configuration of a CMOS solid-state imaging device of the related art (a relation between an imaging region and a peripheral circuit) will be specifically described with reference to FIG. 1. The solid-state imaging device 101 of the related art includes, on a common semiconductor substrate, an imaging region 102 having many pixels 101a each formed by a photodiode and several transistors and arranged in a two-dimensional matrix; and a peripheral circuit of controlling the transistors in the imaging region 102 to detect an output signal from each of the pixels 101a. In this example, the peripheral circuit has a vertical driving circuit 103, a column signal processing circuit 104; a horizontal driving circuit 105; a horizontal signal line 106; an output circuit 107; and a control circuit 108.

In the imaging region 102 of the solid-state imaging device 101, row control lines are each wired in a transverse direction (horizontal direction) of the figure for each row of the plurality of pixels 101a arranged in a two-dimensional matrix, and vertical signal lines 109 are each wired in a longitudinal direction (vertical direction) of the figure for each line of the pixels. In the imaging region, light from outside is collected in the photodiode to cause photoelectric conversion, so that signal charges are generated corresponding to an amount of light. When a control pulse enters a read gate of a transfer transistor provided in each of the pixels, the signal charges are transferred to a floating diffusion portion from the photodiode. A potential of the floating diffusion portion is changed by transference of the charges. The floating diffusion portion is connected to a gate of an amplifying transistor, so that current based on the change in potential of the floating diffusion portion is transmitted to the peripheral circuit through a vertical signal line.

In the solid-state imaging device 101 having such a configuration, the pixels 101a in the imaging region 102 are each sequentially selected and scanned row by row by the vertical driving circuit 103 formed by a shift resistor and the like. Accordingly, a necessary control pulse is supplied to each of the pixels in the selected row through the aforementioned row control line. A signal output from each of the pixels in the selected row is supplied to the column signal processing circuit 104 through the vertical signal line 109. The column signal processing circuit 104 receives the signals output from one row of pixels 101a according to columns. The signals are subjected to processing such as CDS (Correlated Double Sampling) to remove fixed pattern noise inherent to the pixels 101a or signal amplification. The processed signals are output as pixel signals from each of the column signal processing circuits 104. Specifically, the column signal processing circuits 104 are each sequentially selected by the horizontal driving circuit 105 formed by a shift resister, for example, so that the signals are sequentially output as horizontal scanning pulses $\phi H1$ to $\phi Hn$. In the output circuit 107, the signals sequentially supplied from each of the column signal processing circuits 104 through the horizontal signal line 106 are subjected to various types of processing. Specific examples of the signal processing in the output circuit 107 include buffering. Examples of processing prior to buffering include black level adjustment, correction of variation between the lines, signal amplification, and color relation processing. The control circuit 108 receives data to instruct an operation mode or the like of the solid-state imaging device 101 from outside; and outputs data including information of the solid-state imaging device 101 of the related art. The control circuit also generates a clock signal, a control signal, and the like as criteria for operation of the vertical driving circuit 103, the column signal processing circuits 104, the horizontal driving circuit 105, and the like based on a vertical synchronizing signal, a horizontal synchronizing signal, a master clock, and the like, and supplies the signals to the vertical driving circuit 103, the column signal processing circuits 104, the horizontal driving circuit 105, and the like.

Here, the pixel 101a may be configured to have a so-called three-transistor circuit shown in FIG. 2, for example. In this circuit configuration, a cathode (n-type region) of a photodiode is connected to a gate of an amplifying transistor Tr3 through a transfer transistor Tr1. A node electrically linked to the gate of the amplifying transistor Tr3 is called a floating diffusion portion. The transfer transistor Tr1 is connected to a transfer line 111 between the photodiode and the floating diffusion portion; is turned on by supplying a transfer pulse $\phi TRG$ to a gate of the transfer transistor Tr1 through the transfer line 111; and transfers signal charges photoelectrically converted in the photodiode to the floating diffusion portion.

A reset transistor Tr2 has a drain connected to a pixel power supply Vdd1 and a source connected to the floating diffusion portion. The reset transistor Tr2 is turned on by supplying a reset pulse $\phi RST$ to a gate of the reset transistor Tr2 through a reset line 112; and discharges charges in the floating diffusion portion to the pixel power supply Vdd1 to reset the floating diffusion portion prior to transfer of the signal charges to the floating diffusion portion from the photodiode. The amplifying resistor Tr3 has a gate connected to the floating diffusion portion, a drain connected to a pixel power supply Vdd2, and a source connected to a vertical signal line 113. The amplifying transistor Tr3 outputs a potential of the floating diffusion portion after being reset by the reset transistor Tr2 to the vertical signal line as a reset level; and outputs a potential of the floating diffusion portion to the vertical signal line 113 as a signal level after the transfer transistor Tr1 transfers the signal charges. The pixel power supply Vdd1 is switched between a high level and a lower level by driving the pixel, so that the drain of the amplifying transistor Tr3 is changed.

Alternatively, the pixel 101a may be configured to have a so-called four-transistor circuit shown in FIG. 3, for example. This circuit configuration has four transistors Tr1 to Tr4 in addition to a photoelectric conversion element, for example a photodiode. Here, the transistors Tr1 to Tr4 are formed as N-channel MOS transistors, for example. The photodiode photoelectrically converts received light into an amount of optical charges (electrons in this case) corresponding to an amount of the light. A cathode (n-type region) of the photodiode is connected to a gate of the amplifying transistor Tr3 through the transfer transistor Tr1. A node electrically linked to the gate of the amplifying transistor Tr3 forms a floating diffusion portion.

Wirings in a transverse direction, specifically, a transfer line 114, a reset line 115, and a selection line 116 are common for the pixels in an identical row and controlled by the vertical driving circuit. However, a p well wiring 117 to fix a p well potential of the pixel 101a is fixed to a ground potential. In this configuration, the transfer transistor Tr1 is connected to the transfer line 114 between the cathode of the photodiode and the floating diffusion portion; is turned on by supplying a transfer pulse φTRG to a gate of the transfer transistor Tr1 through the transfer line 111; and transfers the optical charges photoelectrically converted in the photodiode to the floating diffusion portion.

The reset transistor Tr2 has a drain connected to a pixel power supply Vdd and a source connected to the floating diffusion portion; is turned on by supplying a reset pulse φRST to a gate of the reset transistor Tr2 through the reset line 115; and discharges charges in the floating diffusion portion to the pixel power supply Vdd to reset the floating diffusion portion prior to transfer of the signal charges to the floating diffusion portion from the photodiode. The amplifying transistor Tr3 has a gate connected to the floating diffusion portion and a drain connected to the pixel power supply Vdd; outputs a potential of the floating diffusion portion after being reset by the reset transistor Tr2 as a reset level; and outputs a potential of the floating diffusion portion as a signal level after the transfer transistor Tr1 transfers the signal charges.

The selection transistor Tr4 has a drain connected to a source of the amplifying transistor Tr3 and a source connected to a vertical signal line 118, for example; is turned on by supplying a reset pulse φSEL to a gate of the selection transistor Tr4 through the selection line 116; and relays a signal output from the amplifying transistor Tr3 to the vertical signal line 118, with the pixel 101a in a selected state.

A photodiode and each transistor in a pixel are typically formed on a common semiconductor substrate; however, each transistor has different important properties.

For example, properties important for a transistor in a peripheral circuit (peripheral transistor; peripheral Tr) are high-speed operation and low power consumption. On the other hand, properties important for a transistor in an imaging region (pixel transistor; pixel Tr), particularly a transfer transistor, are low noise and uniformity (small difference between transistors). Examples of the pixel transistor include an amplifying transistor (AMP transistor), a selection transistor (SEL transistor), and a reset transistor (RST transistor) as described above, in addition to the transfer transistor.

However, in the manufacture of a solid-state imaging device, it is preferable to form pixel transistors and peripheral transistors at the same time to reduce the number of processes, because elements are often formed by many processes.

Examples of such processes for forming a transistor include formation of a well, channel implantation, formation of a gate oxide film and a gate, formation of a side wall, formation of an LDD (Lightly Doped Drain) structure, formation of a source and a drain by implantation, and silicidation. The number of processes, cost, and lead time may be reduced by commonly using these processes for forming peripheral transistors and pixel transistors.

The following methods are proposed for formation of different transistor elements having different demanded properties by use of common processes (e.g. Japanese Unexamined Patent Application Publication No. 2006-24786).

In a first method, high-energy implantation is used for forming a photodiode with a large amount of saturation charges in formation of a well region in an imaging region, and different implantation is used in formation of a well region of a transistor in a peripheral circuit. In a second method, metal silicides (such as TiSi2, CoSi2, NiSi, and PtSi) are used for a transistor in a peripheral circuit demanded to be driven at high speed to reduce various resistances (resistance of a gate electrode, sheet resistance and contact resistance of a source and a drain of a transistor), while silicidation is avoided for a pixel transistor to prevent a high-melting metal generating excess electrons from being included in a photodiode in order to suppress generation of white spots in image data. Formation of different transistors involving silicidation may be performed by a method of forming a high-melting metal block film made of SiN or the like in an imaging region, for example.

It is preferable to perform such first and second methods and furthermore commonly perform the remaining processes (such as channel implantation, formation of a gate oxide film, formation of a gate electrode, and extension implantation) for forming different transistors.

However, in recent years, electronic devices (applications such as portable telephones and video cameras) having a solid-state imaging device has been increasingly demanded to be reduced in size and weight. Accordingly, not only does a lens tend to be reduced in size, but also an optical size in a solid-state imaging device (area occupied by one pixel; pixel size) tends to be reduced. Such a tendency to reduce an optical size is strongly desired to provide image data with increased fineness. Further, specifications (such as materials and dimensions) of elements are often limited by the level of manufacturing technology in a particular era (so-called process generation). Therefore, it may be difficult to modify conditions for forming peripheral transistors even when an optical size is reduced. That is, it may be necessary to reduce an optical size while using common formation processes for peripheral transistors and pixel transistors and not modifying formation conditions for peripheral transistors.

Accordingly, in the manufacture of a small and lightweight solid-state imaging device under the present circumstances, it may be difficult to modify common conditions for pixel transistors and peripheral transistors, while implantation conditions may have to be controlled in forming a photodiode to reduce an optical size. Under such circumstances, it may be difficult to provide pixel transistors with properties basically demanded for the transistors, and some drawbacks may be observed particularly in a floating diffusion portion. Specifically, since a large amount of impurities (ions) are implanted into a source and a drain of a transistor to form a diffusion layer, a strong electric field is formed between a P well and the source and drain, so that a volume of the floating diffusion portion is increased and conversion efficiency is decreased.

Further, since electric field concentration is increased near an edge of a transfer transistor gate (TRG), excess electrons flow into the floating diffusion portion due to a crystal defect or the like, so that white spots in the dark are generated in image data. A photoelectric conversion portion is difficult to be driven at low voltage due to an S/N (signal/noise) ratio and the like. When such electric field concentration occurs, white spots may increasingly be generated. White spots generated in this manner differ from general white spots caused by a defect in a photodiode in terms of dependence on temperature and accumulation time, and the presence or absence of the white spots and the degree of the white spots vary between pixels. Therefore, it is difficult to appropriately correct the white spots. Electric field intensity on a TRG edge is simulated, and it is observed that the electric field intensity on the TRG edge is increased by 15% when a pixel area is reduced by 35% without modifying existing process conditions. White spots are increasingly generated in accordance with such an increase in electric field intensity.

Further, as the pixel cell area is miniaturized, a so-called pixel-sharing structure may be adopted, in which parts of the transistors in each pixel are shared by a plurality of pixels to maintain the light reception area of a photoelectric conversion portion. In the case of the pixel-sharing construction, often the floating diffusion portion FD is divided, and in addition to parasitic capacitance due to the diffusion region of respective divided floating diffusion portions FD, the wiring capacitance of a metal wiring connecting the divided floating diffusion portions FD is added, and the conversion efficiency decreases as compared with the case that the pixel-sharing construction is not adopted.

Meanwhile, the electron number that indicates the signal charge is determined by the amount of charge processed in the imaging portion and the floating diffusion portion FD forming the charge accumulation portion. This electron (signal charge) is output to the vertical signal line as a voltage change by means of the source follower operation of an amplifying transistor. In this case, it is preferable to decrease the parasitic capacitance of the floating diffusion portion FD to enhance the conversion efficiency.

Various methods for producing solid-state imaging elements are proposed; for example, Japanese Unexamined Patent Application Publication No. 2004-165479 and Japanese Unexamined Patent Application Publication No. 2005-268812 disclose methods for decreasing the parasitic capacitance.

SUMMARY OF THE INVENTION

According to embodiments of the present invention, there is provided a solid-state imaging device that can be reduced in size while suppressing a reduction in conversion efficiency due to an increase in volume of a floating diffusion portion and generation of white spots due to electric field concentration, and an electronic device including the solid-state imaging device.

According to an embodiment of the present invention, there is provided a solid-state imaging device including: an imaging region having many pixels arranged in a two-dimensional matrix; and a peripheral circuit of detecting output signals from the pixels, where an impurity concentration in a transistor of the pixels is lower than an impurity concentration in a transistor of the peripheral circuit.

According to an embodiment of the present invention, there is provided an electronic device including a solid-state imaging device, the solid-state imaging device having: an imaging region having many pixels arranged in a two-dimensional matrix; and a peripheral circuit of detecting output signals from the pixels, where an impurity concentration in a transistor of the pixels is lower than an impurity concentration in a transistor of the peripheral circuit.

According to an embodiment of the present invention, there is provided a solid-state imaging device in which a plurality of pixels, each configured by a photoelectric conversion portion and a transistor portion, are arranged and the impurity concentration of a semiconductor well region under a floating diffusion portion in each pixel is set lower than the impurity concentration of a semiconductor well region under a pixel transistor portion at the subsequent stage of the floating diffusion portion.

In the solid-state imaging device of the present invention, the impurity concentration of a semiconductor well region under a floating diffusion portion in the pixel is set lower than the impurity concentration of a semiconductor well region under a pixel transistor portion at the subsequent stage of the floating diffusion portion, so that the growth of a depletion layer in the floating diffusion portion becomes greater and the parasitic capacitance in the floating diffusion portion is decreased.

According to an embodiment of the present invention, there is provided a method of producing a solid-state imaging device including the following processes: the process for forming in a cell region for forming a unit pixel cell or pixel-sharing cell of a semiconductor substrate of the first-conductivity-type, the first second-conductivity-type semiconductor well region of the photoelectric conversion portion formation region, the second second-conductivity-type semiconductor well region of the floating diffusion portion formation region, and the third second-conductivity-type semiconductor well region of the pixel transistor portion formation region, wherein the impurity concentration of the second second-conductivity-type semiconductor well region is lower than the impurity concentration of the third second-conductivity-type semiconductor well region; the process for forming the photoelectric conversion portion in the first second-conductivity-type semiconductor well region; and the process for forming the first-conductivity-type diffusion region which forms the floating diffusion portion in the second second-conductivity-type semiconductor well region and the first-conductivity-type diffusion region of the pixel transistor portion at the subsequent stage of the floating diffusion portion in the third second-conductivity-type semiconductor well region.

In the method of producing the solid-state imaging device of the present invention, by forming in the floating diffusion portion formation region, the second second-conductivity-type semiconductor well region with the impurity concentration lower than the impurity concentration of the third second-conductivity-type semiconductor well region of the transistor portion formation region, and forming the first-conductivity-type diffusion region that forms the floating diffusion portion in the second second-conductivity-type semiconductor well region, the growth of the depletion layer in the floating diffusion portion is increased, and the parasitic capacitance in the floating diffusion portion can be decreased.

A solid-state imaging device according to an embodiment of the present invention may be reduced in size while suppressing a reduction in conversion efficiency due to an increase in volume of a floating diffusion portion and generation of white spots due to electric field concentration, because an impurity concentration in a transistor of pixels is lower than an impurity concentration in a transistor of a peripheral circuit in the solid-state imaging device.

An electronic device according to an embodiment of the present invention may handle more excellent image data, because the electronic device includes a solid-state imaging device where an impurity concentration in a transistor of pixels is lower than an impurity concentration in a transistor of a peripheral circuit.

A solid-state imaging device according to an embodiment of the present invention can enhance the conversion efficiency of the pixel and can efficiently perform voltage conversion of the photo-electrically converted charge, because the growth of the depletion layer in the floating diffusion portion increases and thereby the parasitic capacitance decreases. A method of producing a solid-state imaging device according to an embodiment of the present invention can produce a solid-state imaging device that can enhance the conversion efficiency of pixels, because in the device, the growth of the depletion layer in the floating diffusion portion is large and the parasitic capacitance is reduced.

BRIEF DESCRIPTION OF THE DRAWINGS

FIGS. 26A and 26B are the first production process diagrams illustrating an embodiment of the method of producing the pixel portion of the solid-state imaging device according to the example of FIG. 25.

FIGS. 27A and 27B are the second production process diagrams illustrating the embodiment of the method of producing the pixel portion of the solid-state imaging device according to the example of FIG. 25.

FIGS. 28A and 28B are the third production process diagrams illustrating the embodiment of the method of producing the pixel portion of the solid-state imaging device according to the example of FIG. 25.

DESCRIPTION OF THE PREFERRED EMBODIMENTS

An embodiment of the present invention will be described below with reference to drawings.

The present embodiment will be described taking, as an example, a case where an n-type semiconductor substrate is used as a substrate and an NMOS transistor is used as a peripheral CMOS transistor.

<Embodiment of Solid-State Imaging Device>

Figure 4A:
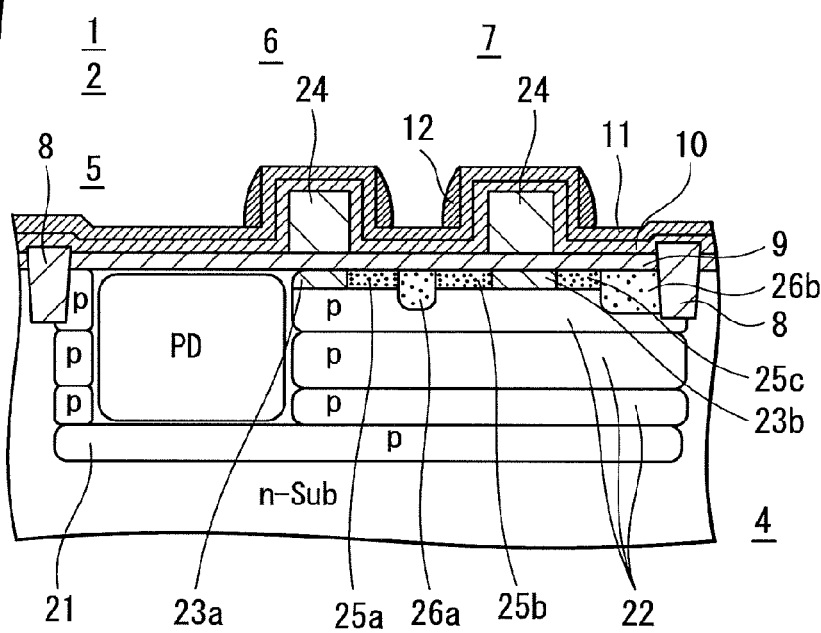
FIGS. 4A to 4C are a schematic cross-sectional view of a pixel in an example of a solid-state imaging device according to an embodiment of the present invention, a first schematic cross-sectional view of a transistor in a peripheral circuit of the solid-state imaging device, and a second schematic cross-sectional view of the transistor, respectively.
Figure 4B:
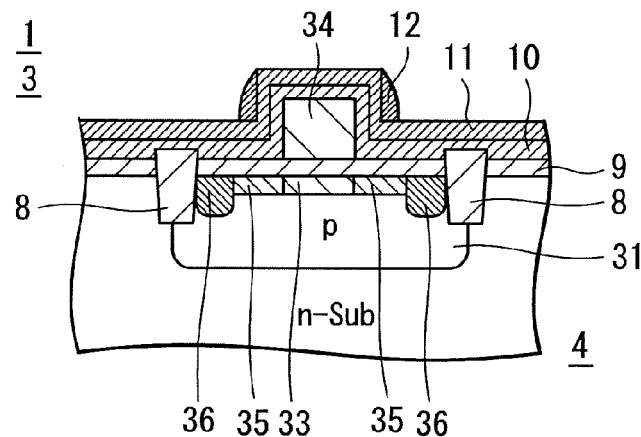
Figure 4C:
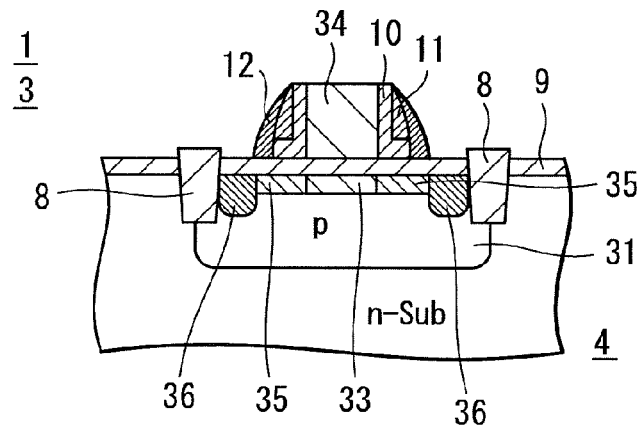

FIGS. 4A to 4C are a schematic cross-sectional view of a pixel in a solid-state imaging device of the present embodiment, a first schematic cross-sectional view of a transistor in a peripheral circuit of the solid-state imaging device, and a second schematic cross-sectional view of the transistor, respectively. The solid-state imaging device 1 of the present embodiment has many pixels 2 in an imaging region as shown in FIG. 4A and a peripheral circuit 3 of detecting output signals from the pixels as shown in FIGS. 4B and 4C.

In each of the pixels 2 in the solid-state imaging device 1 of the present embodiment, a deep P well 21 is formed in a first-conductive-type (n-type) semiconductor substrate 4 of the pixel 2 which is a common substrate with a peripheral circuit 3, and a photodiode (PD) 5, a transfer transistor 6, and a reset transistor 7 are formed over the deep P well 21.

The photodiode 5 is an embedded photodiode and has a high-concentration p-type impurity thin layer (not shown) provided on its surface to reduce dark current. Element isolation devices 8 are formed on outer sides sandwiching the photodiode 5 and the reset transistor 7. Specific examples of the element isolation devices 8 include STI (Shallow Trench Isolation) devices and LOCOS (Local Oxidation of Silicon) devices.

In the transfer transistor 6 and the reset transistor 7, a channel region 23a and an SD implantation region 26a of the transfer transistor 6 and a channel region 23b and an SD implantation region 26b of the reset transistor 7 are arranged and formed on stepwise P wells 22 over the deep P well 21 (that is, on a surface of the semiconductor substrate 4) in this order from the photodiode. An extension implantation region 25a is provided between the channel region 23a and the SD implantation region 26a. An extension implantation region 25b is provided between the SD implantation region 26a and the channel region 23b. An extension implantation region 25c is formed between the channel region 23b and the SD implantation region 26b. Further, a gate oxide film 9 is formed on the surface of the semiconductor substrate 4. A gate electrode 24a and a gate electrode 24b are formed on the channel region 23a and the channel region 23b, respectively, through the gate oxide film 9. The transfer transistor 6 and the reset transistor 7 are formed in this manner.

Figure 5:
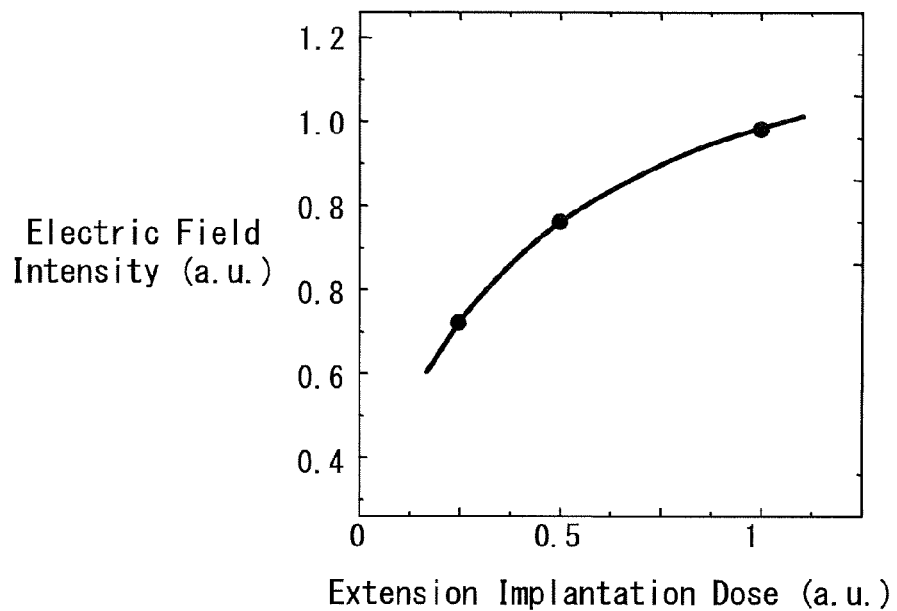
FIG. 5 is a view for describing an example of a solid-state imaging device according to an embodiment of the present invention.

Here, FIG. 5 shows results of simulating a relation between an impurity concentration in the SD implantation region 26a forming a floating diffusion portion (FD) and electric field intensity. The results show that electric field intensity on an edge of a transfer transistor gate (TRG) strongly depends on a concentration of an extension for forming an LDD structure.

In the solid-state imaging device 1 of the present embodiment, the impurity concentration in at least the extension implantation region 25a of the transfer transistor 6 among the transistors of the pixel 2 as shown in FIG. 4A is made different from, in this example lower than the impurity concentration in an extension implantation region 35 of the peripheral circuit 3 as shown in FIGS. 4B and 4C or an implantation region of another transistor in the pixel (such as an amplifying transistor; not shown).

Accordingly, in the solid-state imaging device 1 of the present embodiment, the extension implantation region 25a on a transfer transistor 6 side of the SD implantation region 26a corresponding to a floating diffusion portion (FD) has a low impurity concentration, making it possible to reduce electric field intensity and suppress white spots in the dark of image data caused by flowing excess electrons into the floating diffusion portion.

The extension implantation region 25a may be simultaneously formed with the extension implantation regions 25b and 25c around the reset transistor in the same impurity concentration as described in the production method described later, which may simplify the manufacturing process. However, impurity concentrations in the extension implantation regions 25b and 25c around the reset transistor may be different from an impurity concentration in the extension implantation region 25a. For example, the extension implantation regions 25b and 25c and an implantation region of an amplifying transistor may be formed simultaneously in the same impurity concentration.

Here, an example of a method for manufacturing the solid-state imaging device will be described with reference to FIGS. 6 to 20.

Figure 6A:
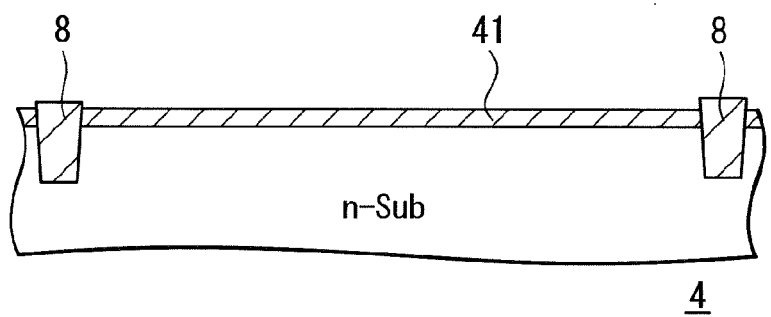
FIGS. 6A and 6B are process drawings for describing a method for manufacturing an example of a solid-state imaging device according to an embodiment of the present invention, respectively.
Figure 6B:
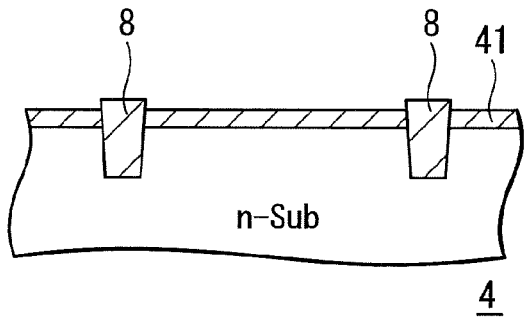

First, the element isolation devices 8 are formed at a predetermined interval on a surface of the first conductive (n-type) semiconductor substrate 4, as shown in the process drawings of FIGS. 6A and 6B for the pixel and the peripheral circuit, respectively. Then, an oxide film (sacrificial oxide film) 41 with a thickness of about 10 nm is deposited as an implant-through film.

Figure 7A:
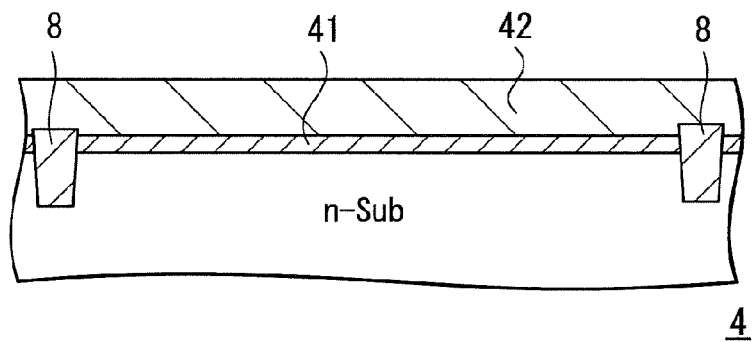
FIGS. 7A and 7B are process drawings for describing a method for manufacturing an example of a solid-state imaging device according to an embodiment of the present invention, respectively.
Figure 7B:
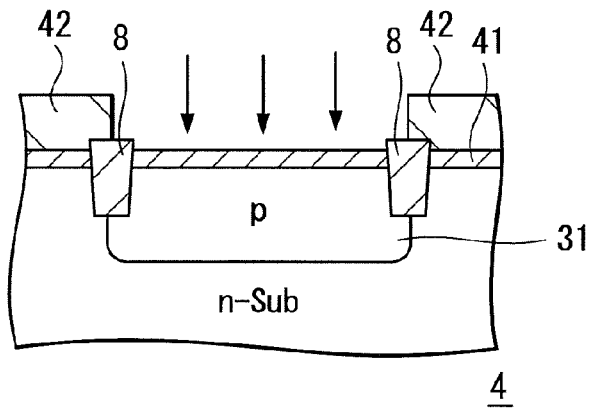

Next, a P well region 31 for forming a transistor in the peripheral circuit is formed as shown in the process drawings of FIGS. 7A and 7B for the pixel and the peripheral circuit, respectively. Boron ions are implanted in two steps to form the P well region at a depth of about 2 to 3 m.

Figure 8A:
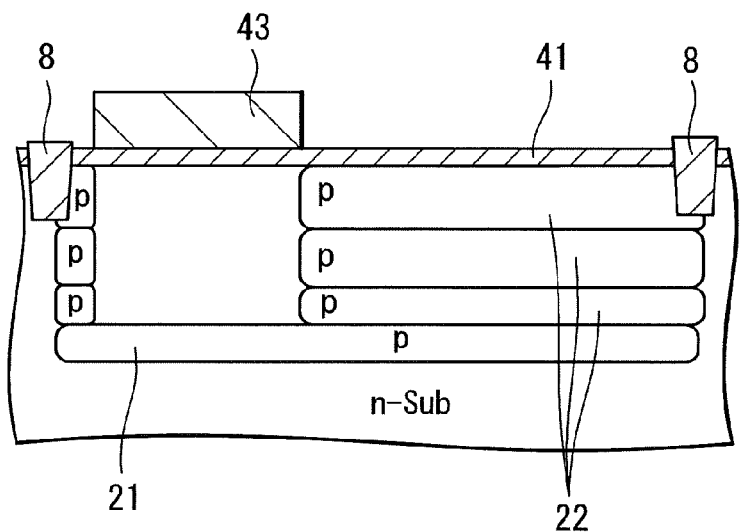
FIGS. 8A and 8B are process drawings for describing a method for manufacturing an example of a solid-state imaging device according to an embodiment of the present invention, respectively.
Figure 8B:
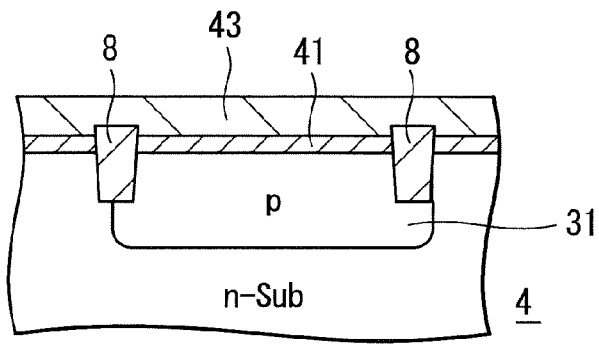

On the other hand, the P well 21 deeper than the P well for the peripheral transistor is formed in the pixel to increase an amount of saturation charges of the photodiode, as shown in the process drawings of FIGS. 8A and 8B for the pixel and the peripheral circuit, respectively. The deepest P well is previously formed in the whole pixel by high-energy implantation in order to form an overflow barrier from the photodiode. The P well 21 appropriately has a depth of about 3 to 4 m taking into consideration an optical absorption coefficient of Si. The P wells 22 are formed stepwise on the deep P well 21 with the photodiode of each of the pixels covered with a resist 43. Specifically, energy is implanted in several steps to mutually connect the P wells ranging from the deepest P well to the P well near the surface.

Figure 9A:
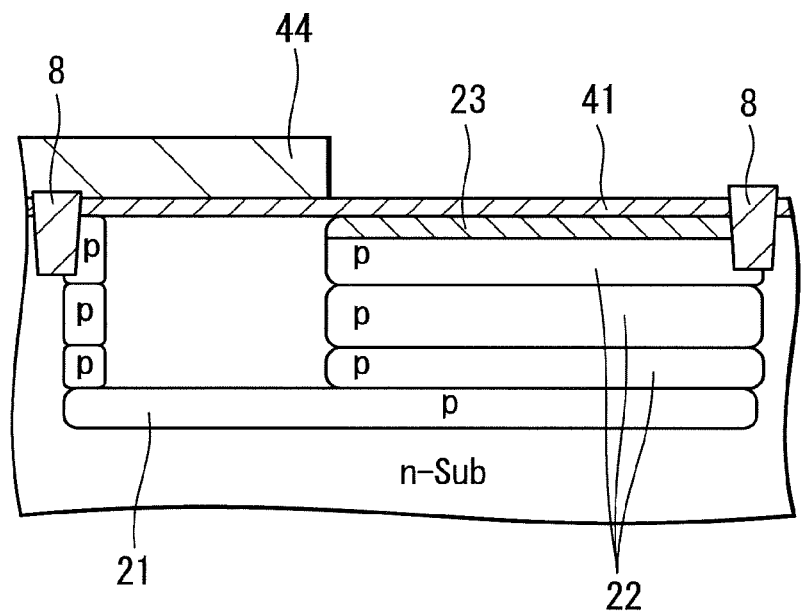
FIGS. 9A and 9B are process drawings for describing a method for manufacturing an example of a solid-state imaging device according to an embodiment of the present invention, respectively.
Figure 9B:
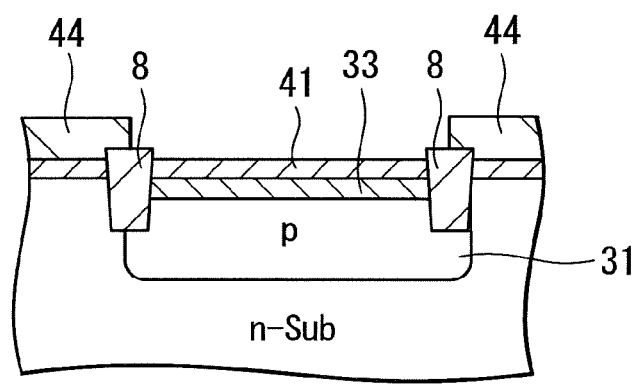

Next, channel implantation is performed to control threshold voltage of a finally formed transistor to form a channel layer 23 finally formed as the channel regions 23a and 23b, as shown in the process drawings of FIGS. 9A and 9B for the pixel and the peripheral circuit, respectively. In this process, common channel implantation is performed for pixel transistors and peripheral transistors to form a channel layer 33 as well, resulting in a reduction in the number of processes.

Figure 10A:
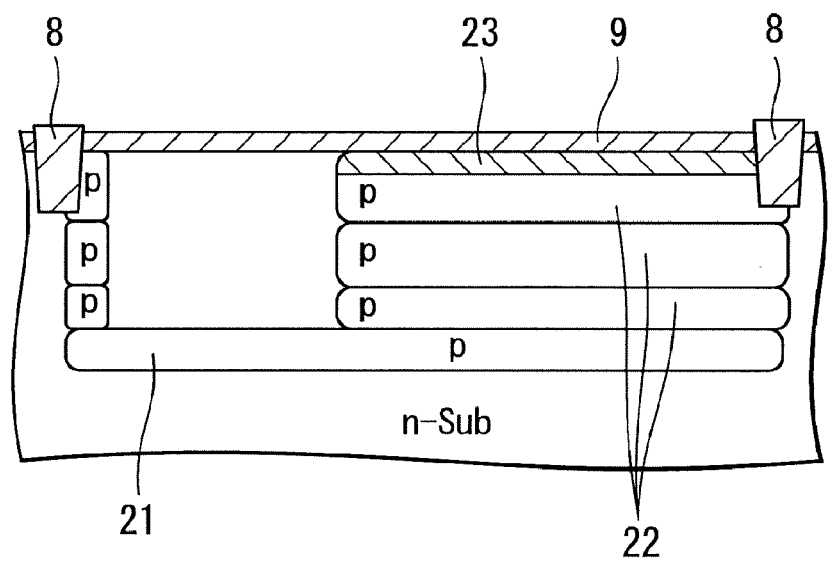
FIGS. 10A and 10B are process drawings for describing a method for manufacturing an example of a solid-state imaging device according to an embodiment of the present invention, respectively.
Figure 10B:
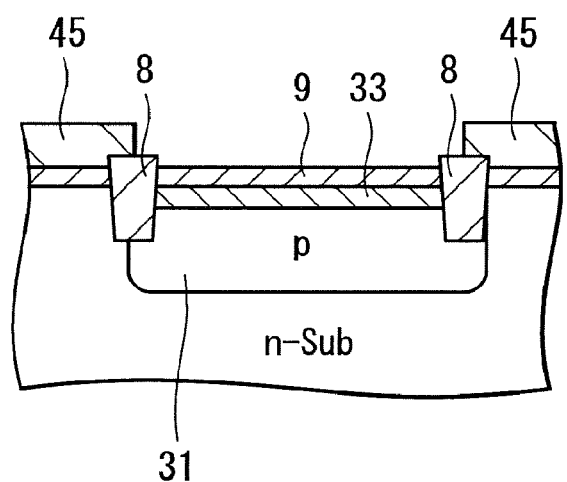

Next, the gate oxide film 9 is formed as shown in the process drawings of FIGS. 10A and 10B for the pixel and the peripheral circuit, respectively.

Figure 11A:
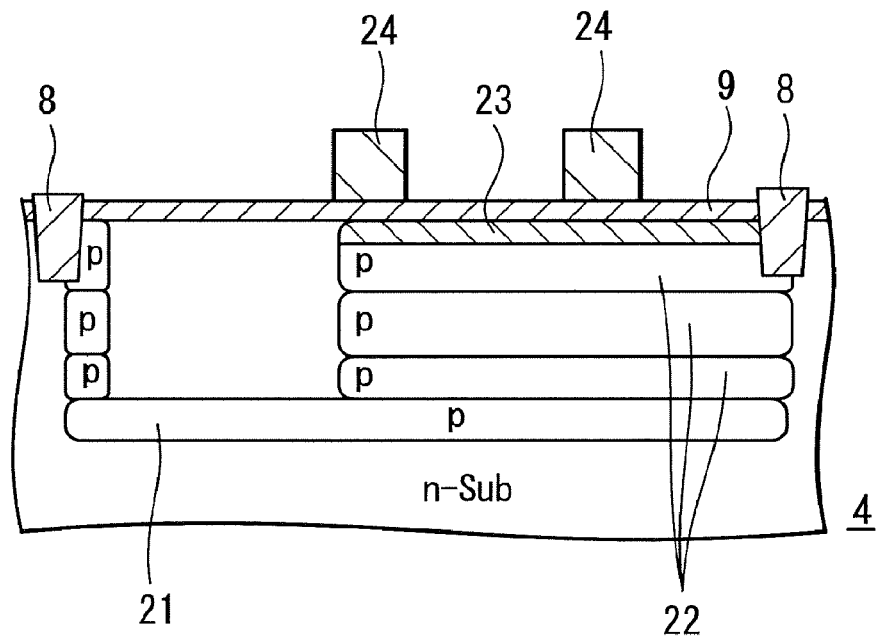
FIGS. 11A and 11B are process drawings for describing a method for manufacturing an example of a solid-state imaging device according to an embodiment of the present invention, respectively.
Figure 11B:
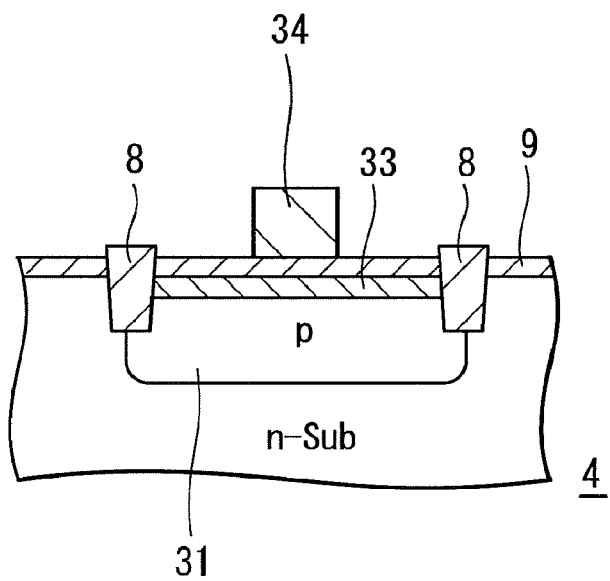

Next, polysilicon gate electrodes 24 and 34 are formed as shown in the process drawings of FIGS. 11A and 11B for the pixel and the peripheral circuit, respectively.

Specifically, a polysilicon film having a thickness of about 150 nm is first deposited by hot-wall LPCVD. Thereafter, a resist having an opening corresponding to an NMOS region (not shown) is formed, and then phosphorus (P) is implanted into the opening and activated by annealing.

Figure 12A:
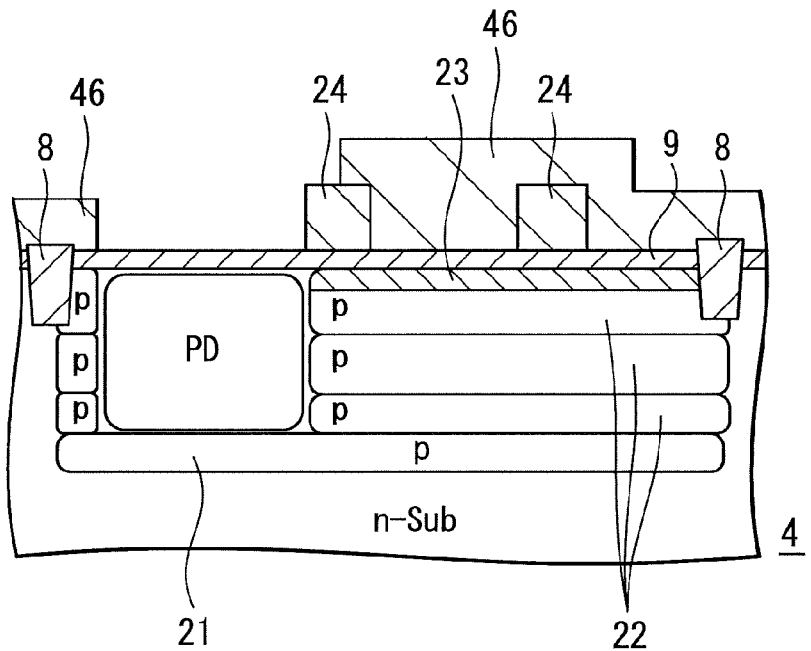
FIGS. 12A and 12B are process drawings for describing a method for manufacturing an example of a solid-state imaging device according to an embodiment of the present invention, respectively.
Figure 12B:
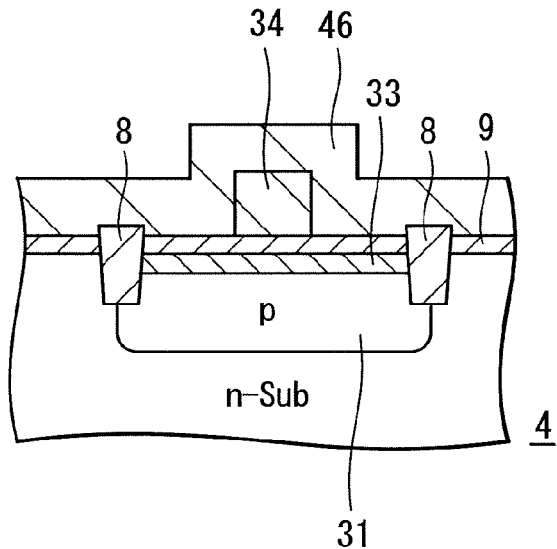

Next, the photodiode (PD) is formed by implantation, as shown in the process drawings of FIGS. 12A and 12B for the pixel and the peripheral circuit, respectively.

Figure 13A:
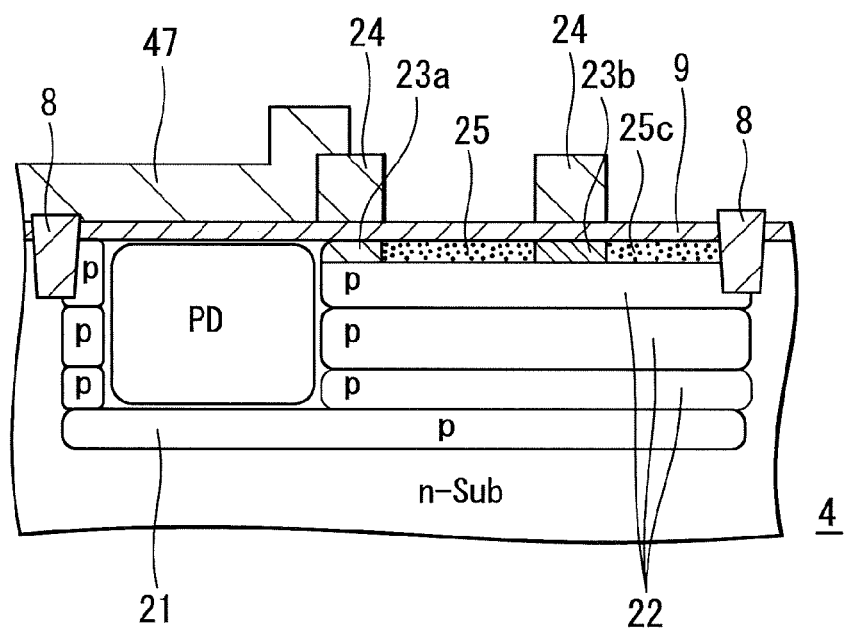
FIGS. 13A and 13B are process drawings for describing a method for manufacturing an example of a solid-state imaging device according to an embodiment of the present invention, respectively.
Figure 13B:
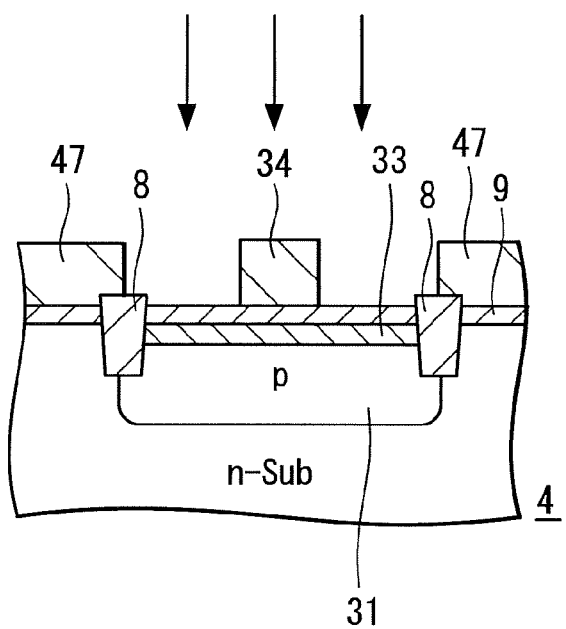
Figure 14A:
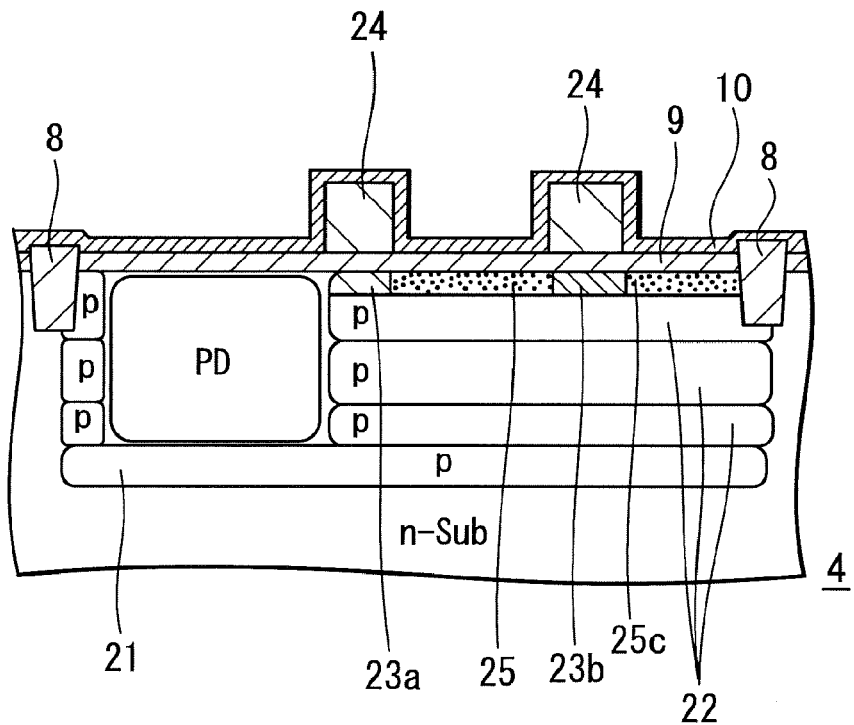
FIGS. 14A and 14B are process drawings for describing a method for manufacturing an example of a solid-state imaging device according to an embodiment of the present invention, respectively.
Figure 14B:
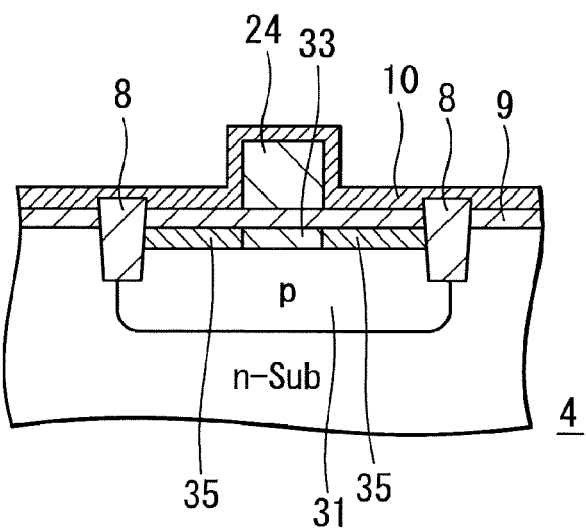
Figure 15A:
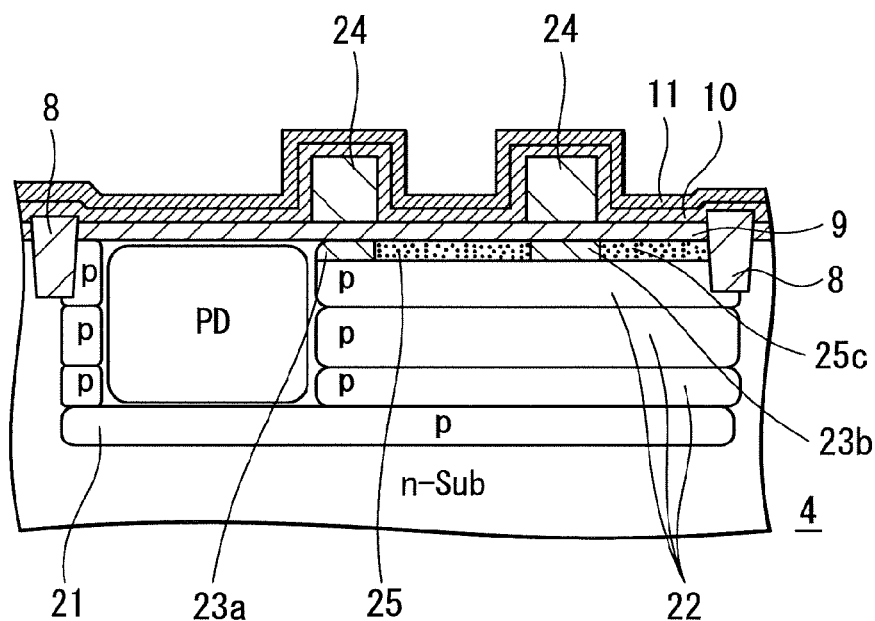
FIGS. 15A and 15B are process drawings for describing a method for manufacturing an example of a solid-state imaging device according to an embodiment of the present invention, respectively.
Figure 15B:
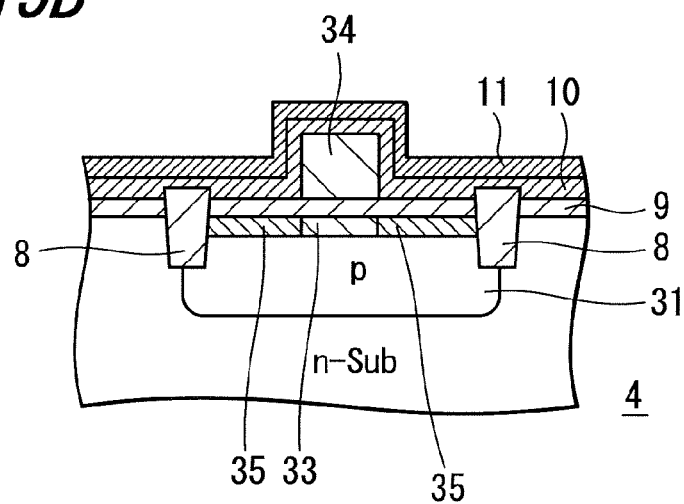
Figure 16A:
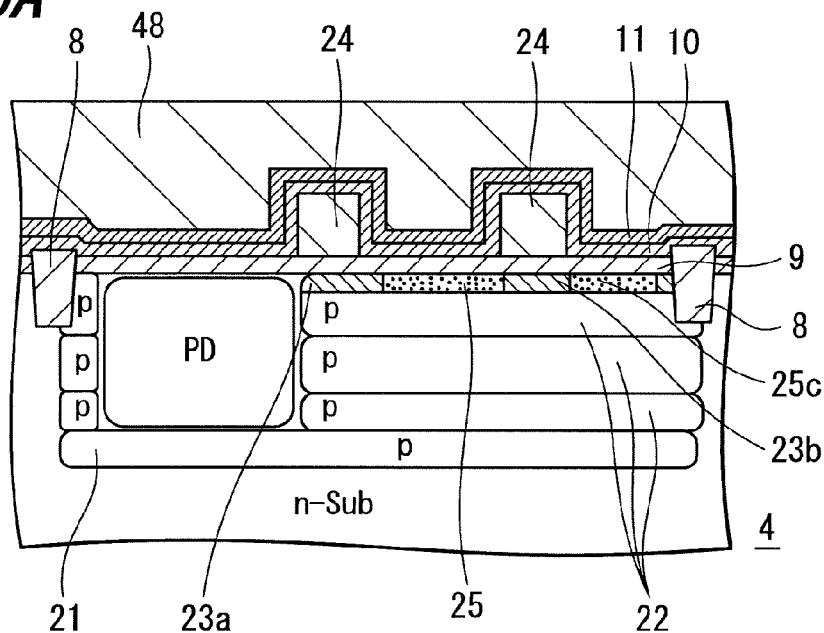
FIGS. 16A to 16C are process drawings for describing a method for manufacturing an example of a solid-state imaging device according to an embodiment of the present invention, respectively.
Figure 16B:
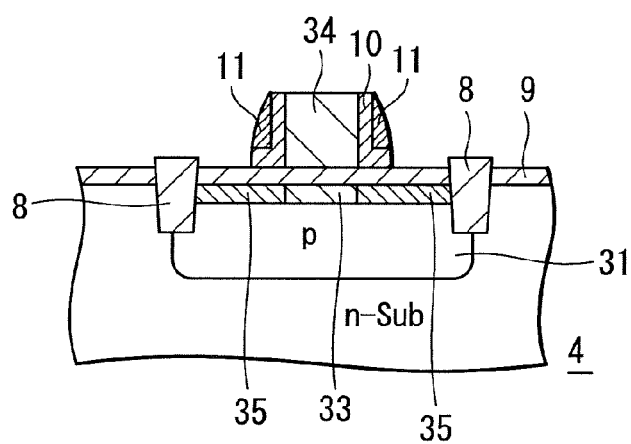
Figure 16C:
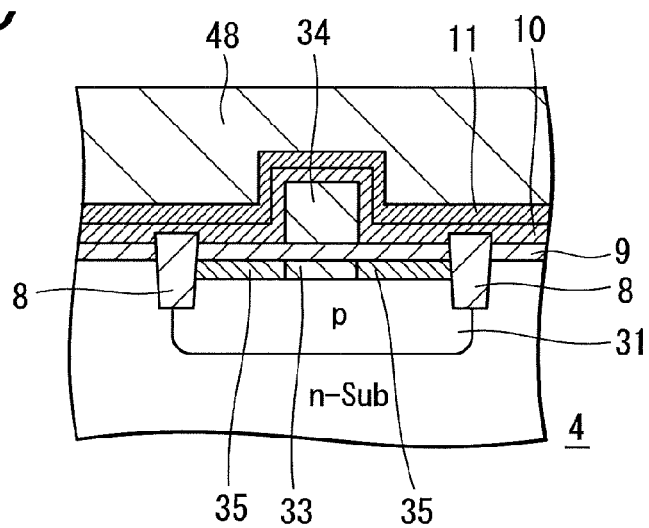
Figure 17A:
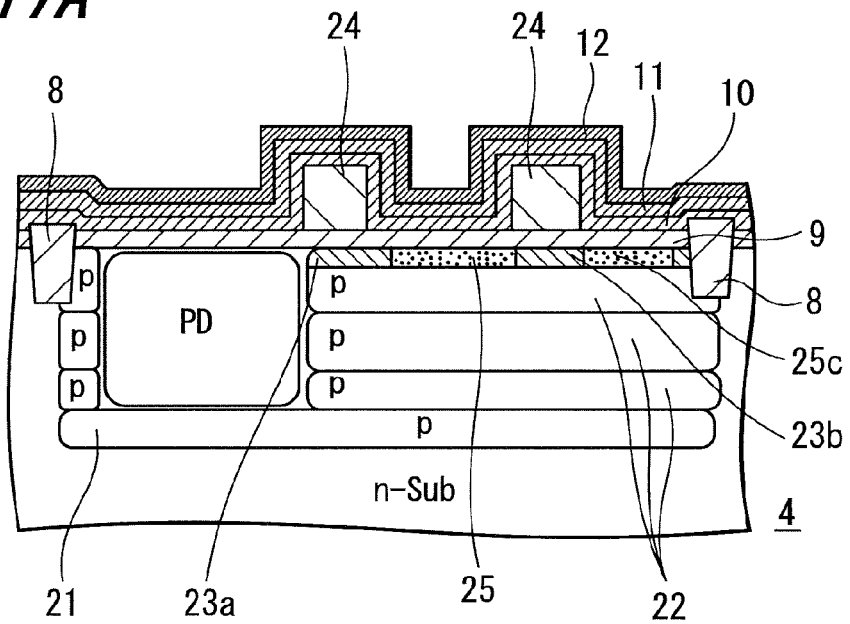
FIGS. 17A to 17C are process drawings for describing a method for manufacturing an example of a solid-state imaging device according to an embodiment of the present invention, respectively.
Figure 17B:
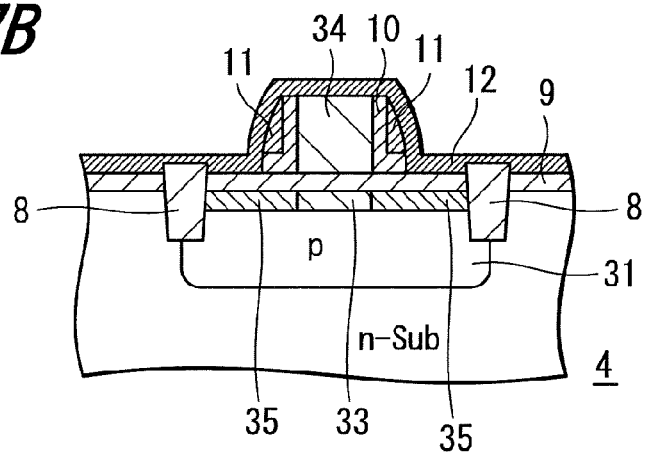
Figure 17C:
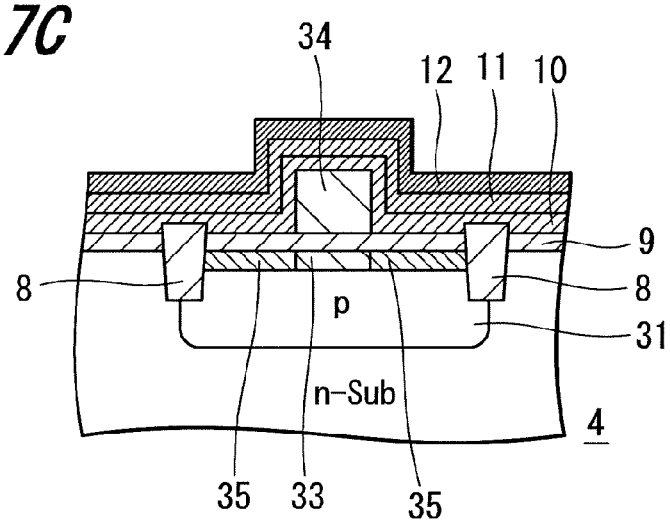
Figure 18A:
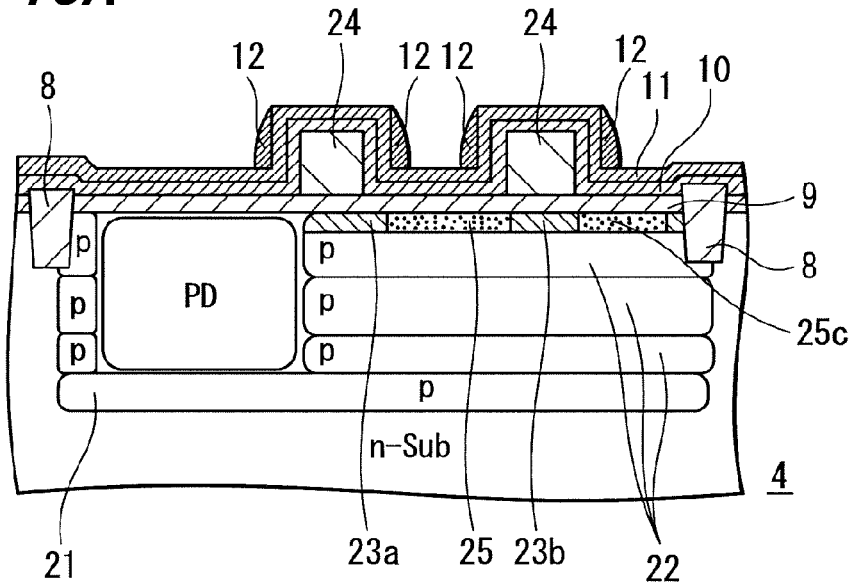
FIGS. 18A to 18C are process drawings for describing a method for manufacturing an example of a solid-state imaging device according to an embodiment of the present invention, respectively.
Figure 18B:
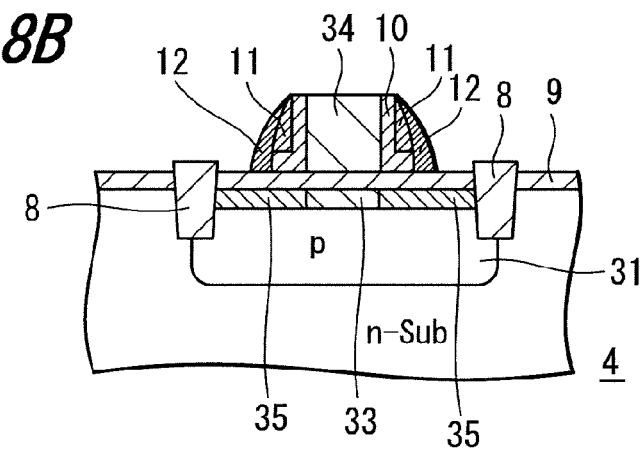
Figure 18C:
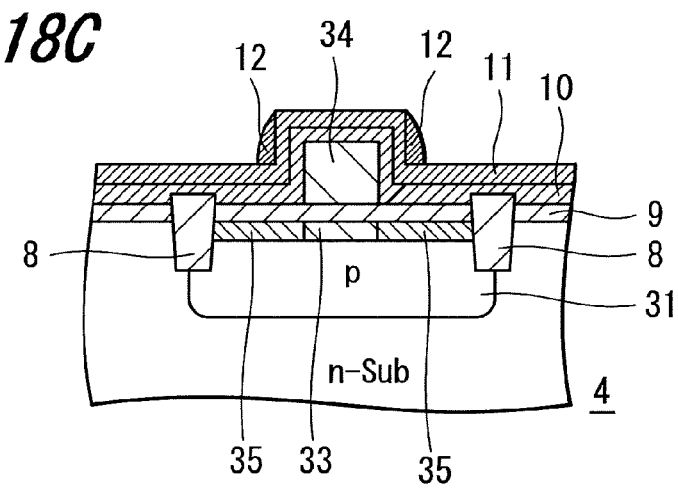

Next, extension implantation is simultaneously performed for the pixel and the peripheral circuit to form an extension implantation layer 25, finally formed as the extension implantation regions 25a and 25b, and the extension implantation region 25c, as shown in the process drawings of FIGS. 13A and 13B for the pixel and the peripheral circuit, respectively.

Next, a side wall is formed as shown in the process drawings of FIGS. 14 to 18. Specifically, a silicon oxide (SiO2) film 10 is deposited as a first layer film of the side wall film as shown in the process drawings of FIGS. 14A and 14B for the pixel and the peripheral circuit, respectively. Next, a silicon nitride (SiN) film 11 is deposited as a second layer film of the side wall film by low-pressure CVD, as shown in the process drawings of FIGS. 15A and 15B for the pixel and the peripheral circuit, respectively. Next, the second layer SiN film 11 is allowed to remain in the pixel and, on the other hand, a side wall spacer is formed by reactive etching in the peripheral circuit, as shown in the process drawings of FIGS. 16A and 16B for the pixel and the peripheral circuit, respectively. The SiN film 11 is allowed to remain as a dense high-melting metal block film in the pixel. Accordingly, generation of leakage current by silicidation may be suppressed which is not preferable for the pixel element. For the same reason, a non-silicide transistor may be preferably formed in part of an analog circuit in the peripheral circuit. In this case, a side wall shape is similar to that of the pixel transistor (FIG. 16C). The SiN film 11 remaining in the pixel forms part of a multi-layer film on the photodiode and affects spectral sensitivity. Therefore, it is preferable to optimize a thickness of the film. In this case, it may be necessary to select a thickness which may retain blocking capability of the film and does not prevent shallow source/drain implantation into a non-silicide region. Next, a silicon oxide (SiO2) film 12 is deposited as a third layer film of the side wall film, as shown in the process drawings of FIG. 17A and FIGS. 17B and 17C for the pixel and the peripheral circuit, respectively. Next, the film 12 is etched back by performing reactive etching again, resulting in a final side wall shape, as shown in the process drawings of FIG. 18A and FIGS. 18B and 18C for the pixel and the peripheral circuit, respectively.

Next, source/drain implantation (SD) is performed using the resulting side wall as a spacer. Ions are implanted in two steps, since the silicide transistor and the non-silicide transistor have implantation through films with different structures.

Figure 1:
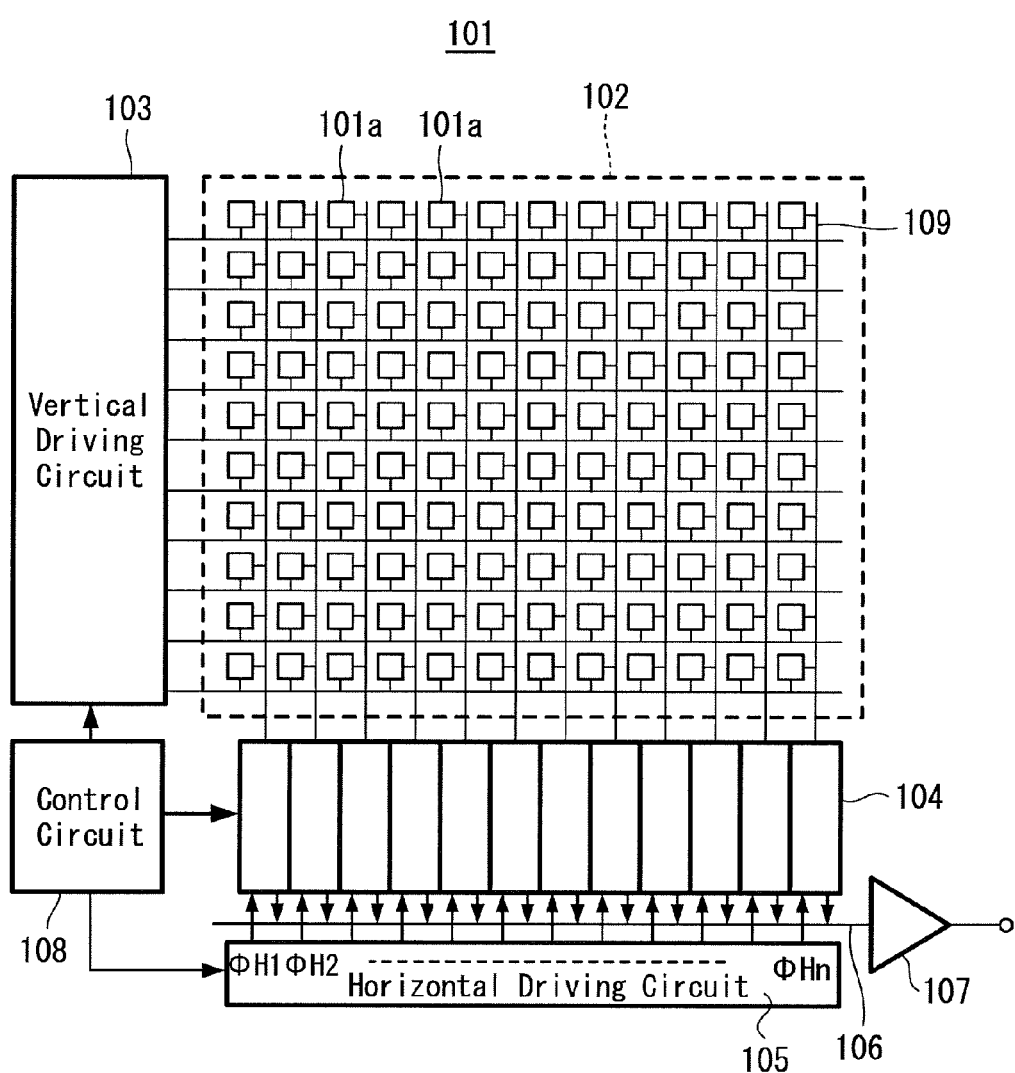
FIG. 1 is a view for describing a solid-state imaging device of the related art.
Figure 2:
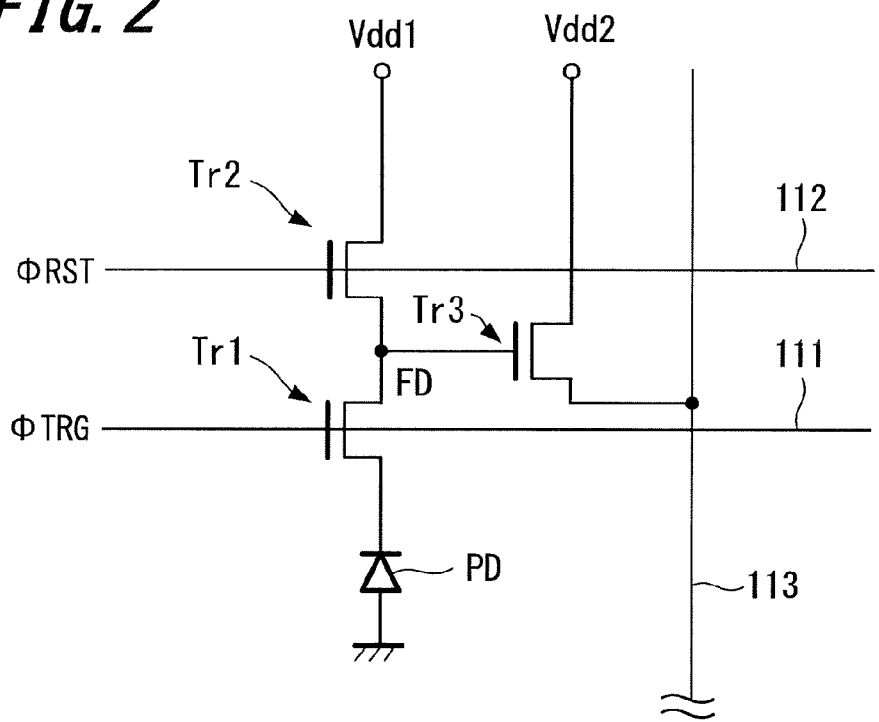
FIG. 2 is a circuit diagram for describing a solid-state imaging device of the related art.
Figure 3:
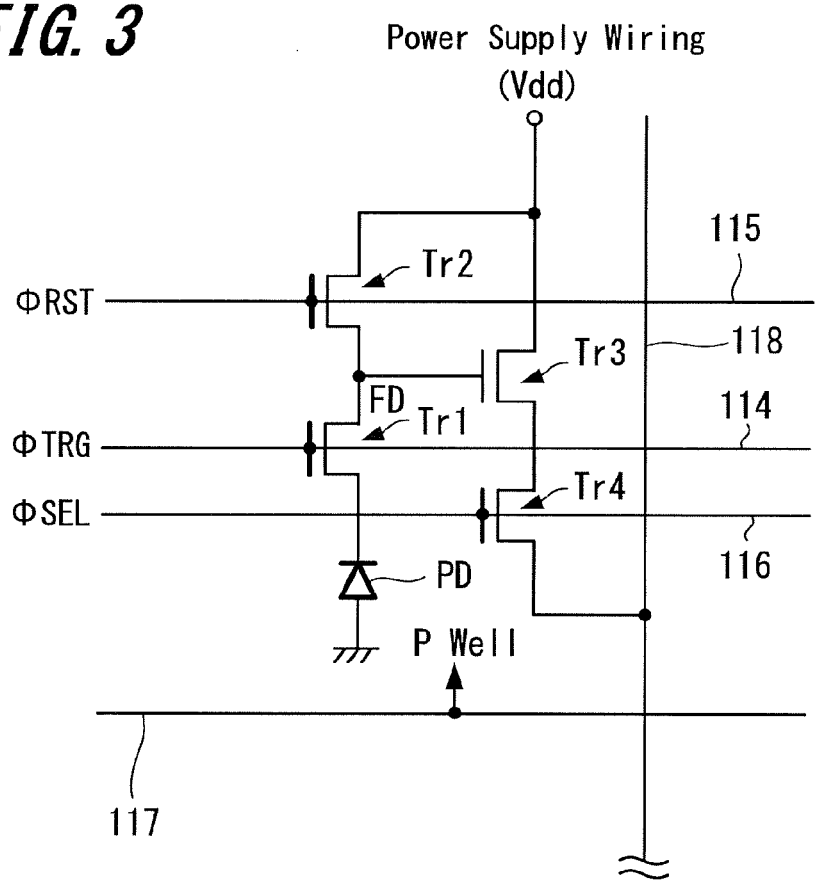
FIG. 3 is a circuit diagram for describing a solid-state imaging device of the related art.
Figure 19A:
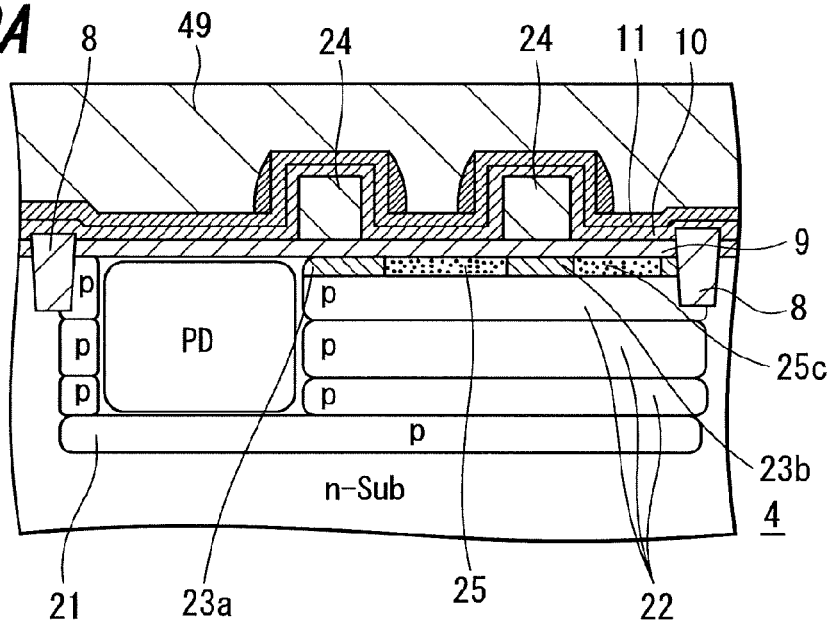
FIGS. 19A to 19C are process drawings for describing a method for manufacturing an example of a solid-state imaging device according to an embodiment of the present invention, respectively.
Figure 19B:
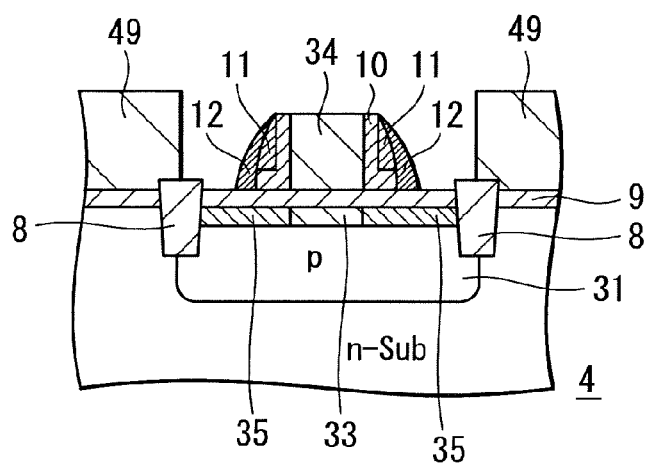
Figure 19C:
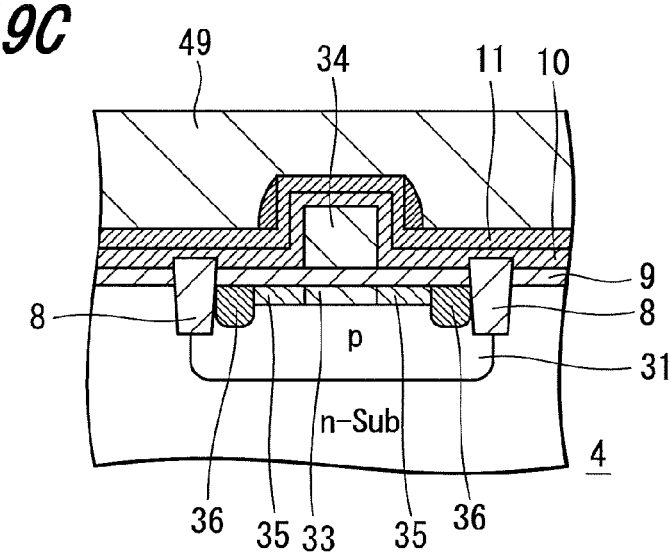
Figure 20A:
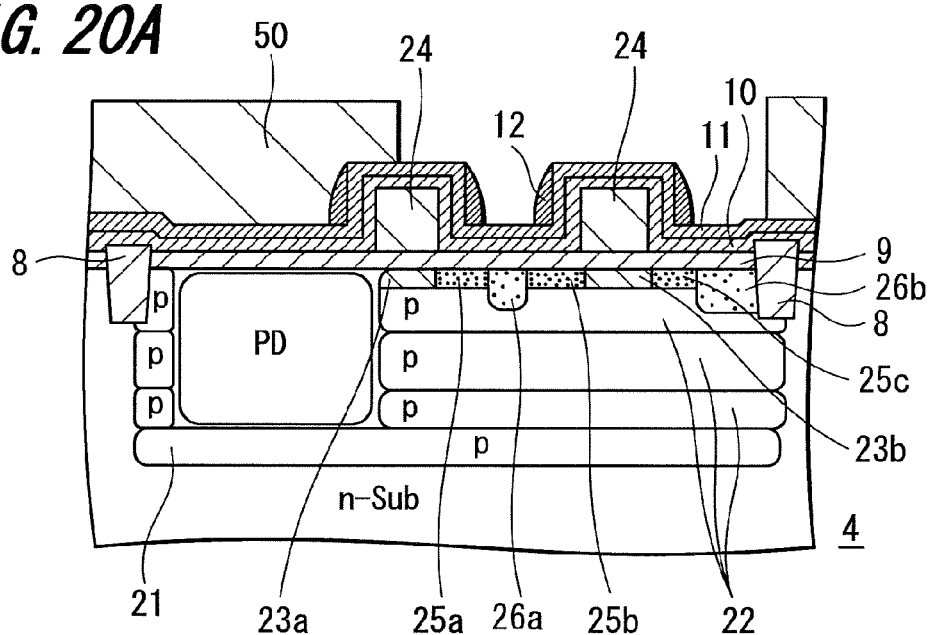
FIGS. 20A to 20C are process drawings for describing a method for manufacturing an example of a solid-state imaging device according to an embodiment of the present invention, respectively.
Figure 20B:
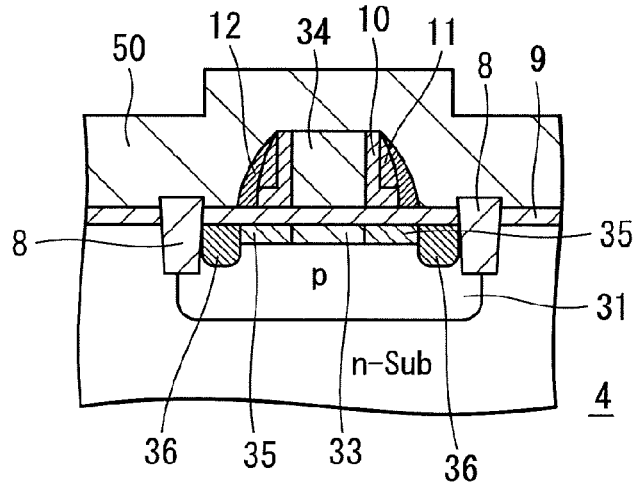
Figure 20C:
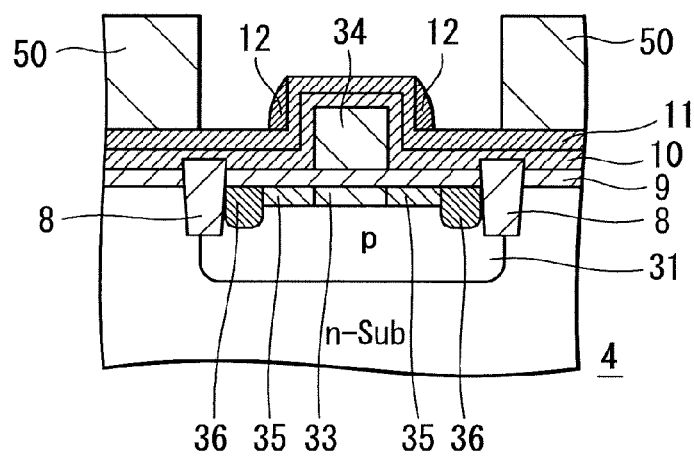

In the present embodiment, SD implantation regions 36 are formed in the silicide transistor, as shown in the process drawings of FIG. 19A and FIGS. 19B and 19C for the pixel and the peripheral circuit, respectively. Then, SD implantation regions 26a and 26b are simultaneously formed for the pixel transistors and the non-silicide transistor in the peripheral circuit, respectively, as shown in the process drawings of FIG. 20A and FIGS. 20B and 20C for the pixel and the peripheral circuit, respectively. Thereafter, the photoresist 50 is removed to provide the solid-state imaging device 1 having the pixels 2 and the peripheral circuit 3 as shown in FIGS. 1A to 1C and having impurities selectively reduced in the extension implantation region 25a in a lower part of the side wall.

EXAMPLES

Examples of the present invention will be described.

Figure 21A:
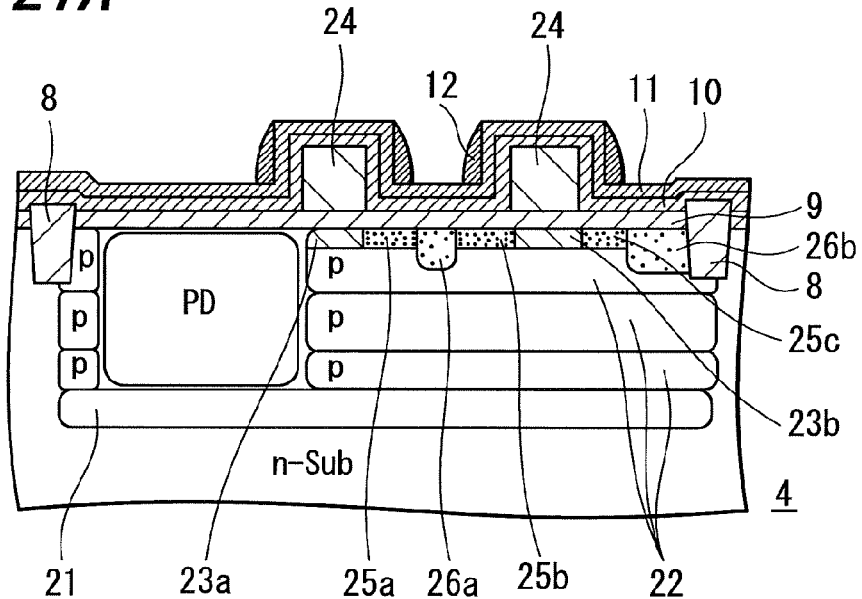
FIGS. 21A to 21C are schematic cross-sectional views for describing an example of a solid-state imaging device according to an embodiment of the present invention, respectively.
Figure 21B:
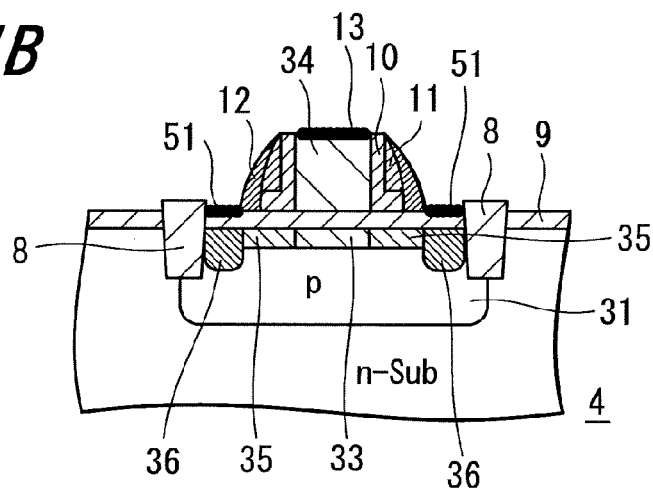
Figure 21C:
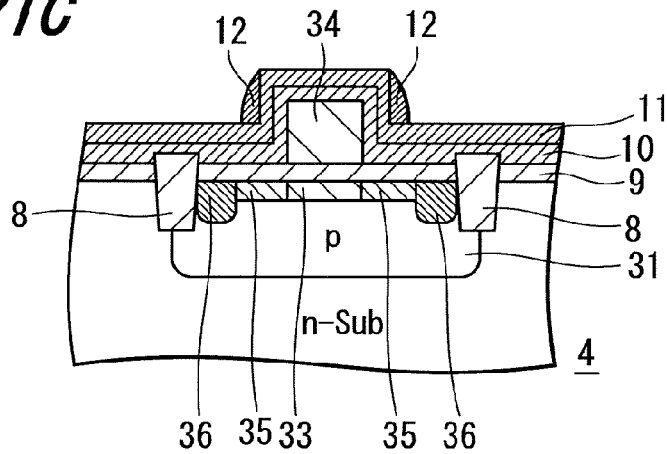

A first example of the present invention will be described with reference to FIGS. 21A to 21C.

In the solid-state imaging device 1 of the present example, an impurity concentration in the FD, specifically, the extension implantation region 25a of the pixel 2 is lower than an impurity concentration in an impurity diffusion layer of a transistor of the peripheral circuit 3. Impurities are generally implanted in the extension implantation region 25a at a surface impurity concentration of $1 \times 10^{20}/cm^3$ or more due to the presence of the impurity diffusion layer in the transistor of the peripheral circuit 3. However, in the solid-state imaging device 1 of the present example, an impurity concentration in the extension implantation region 25a is as low as one-tenth to one-hundredth of such a surface impurity concentration.

Image quality may be preferentially improved in this configuration, since contact resistance usually increases but a slight increase in contact resistance is acceptable for the FD in many cases. An increase in contact resistance may also be suppressed by implanting and activating impurities after forming a contact hole when a salicide process is not performed, although impurities after forming a contact hole may be difficult to be implanted when a transistor in the peripheral circuit is formed through the salicide process.

Figure 22:
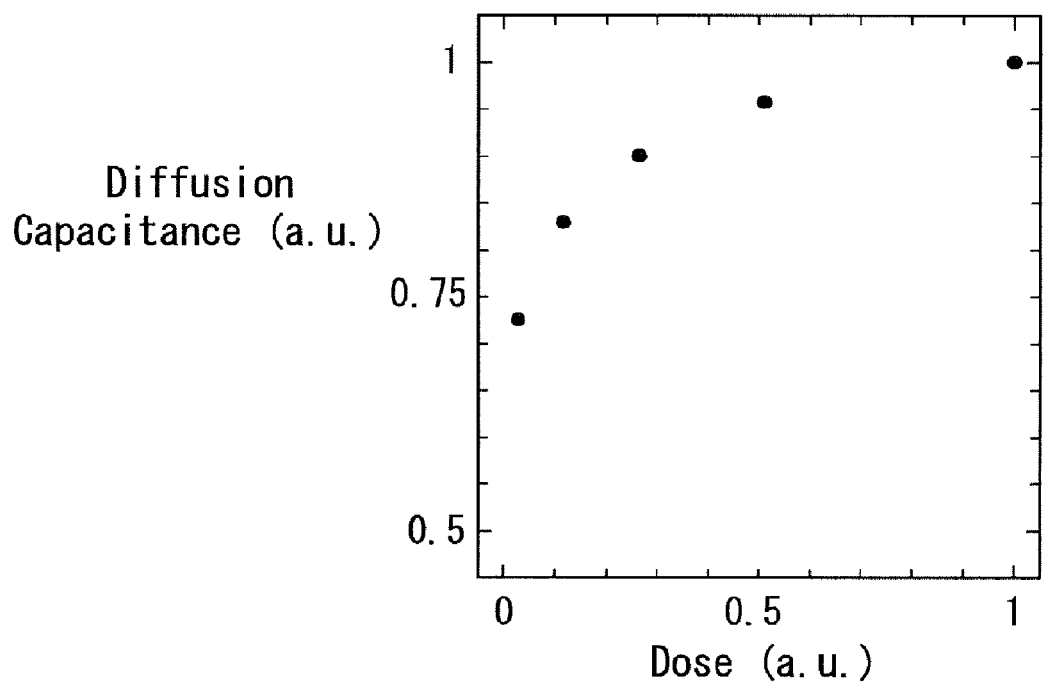
FIG. 22 is a view for describing an example of a solid-state imaging device according to an embodiment of the present invention.

The simulation results shown in FIG. 22 indicate that a diffusion capacitance of the FD strongly depends on an impurity concentration in a diffusion layer (SD implantation region) of a source/drain. According to these results, conversion efficiency may be sufficiently improved when the pixel has a typical shape, although conversion efficiency varies by addition of a capacity of a metal wiring layer, for example.

A second example of the present invention will be described with reference to FIGS. 23A to 23D.

This Example particularly examines a reduction in impurity concentration in the extension implantation region 25a corresponding to the FD. The reduction in impurity concentration in the extension implantation region 25a reduces an electric field that may be generated between a non-inversion region under the gate electrode 24 and the extension region 25a and suppresses generation of leakage current. Accordingly, generation of white spots or the like is suppressed.

Figure 23:
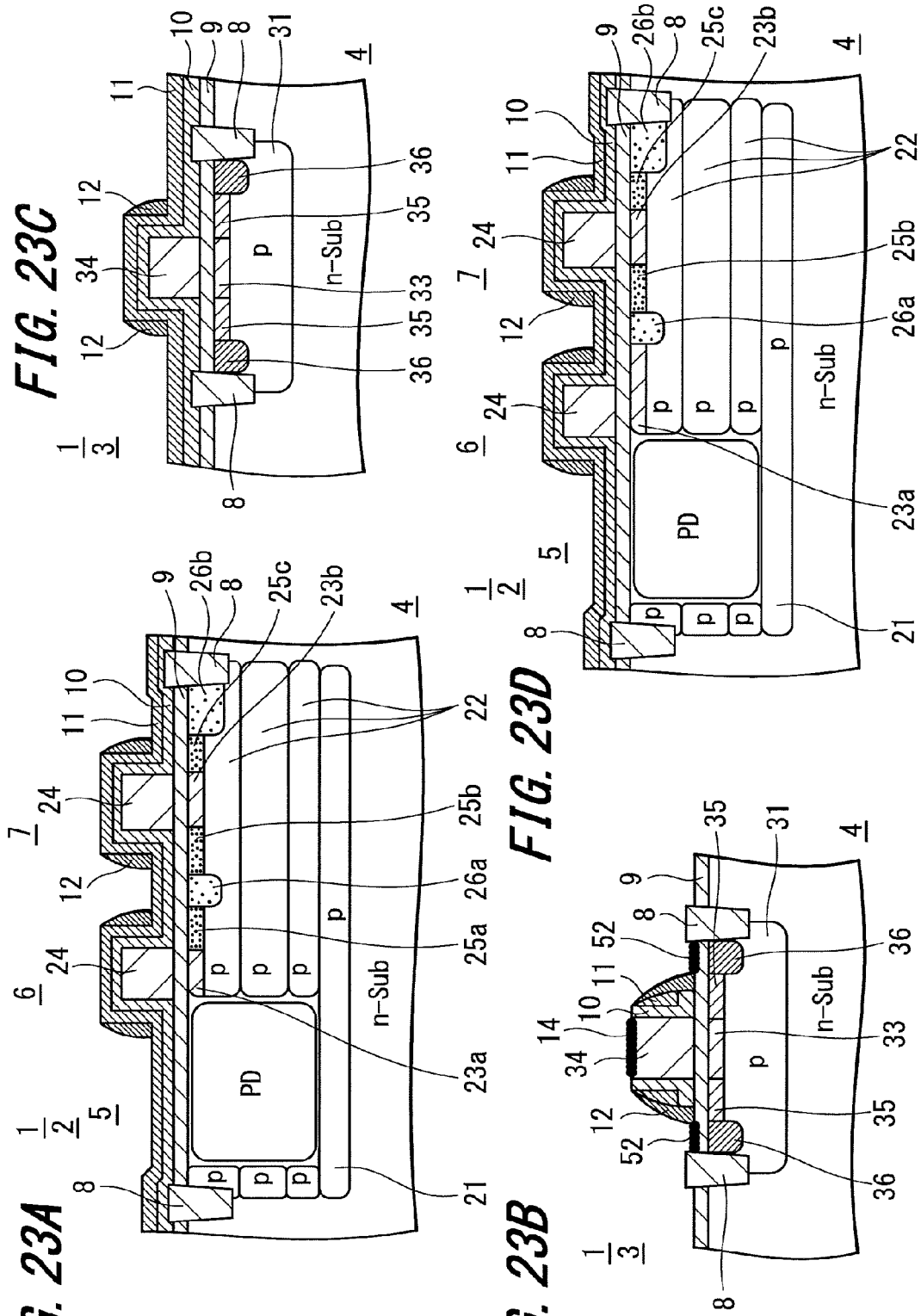
FIGS. 23A to 23D are schematic cross-sectional views for describing an example of a solid-state imaging device according to an embodiment of the present invention, respectively.

As a result of further examination, transfer may be performed and generation of white spots may be suppressed even in a structure as shown in FIG. 23D where the extension implantation region 25 is not formed (impurities are not implanted), specifically, a structure where an offset is formed between the gate and the region in which impurities are implanted. A potential gradient from the PD to the FD is generated even if the diffusion layer does not overlap with the gate, since read operation from the PD to the FD is charge transfer utilizing a difference in potential and the PD is depleted after reading.

Figure 24:
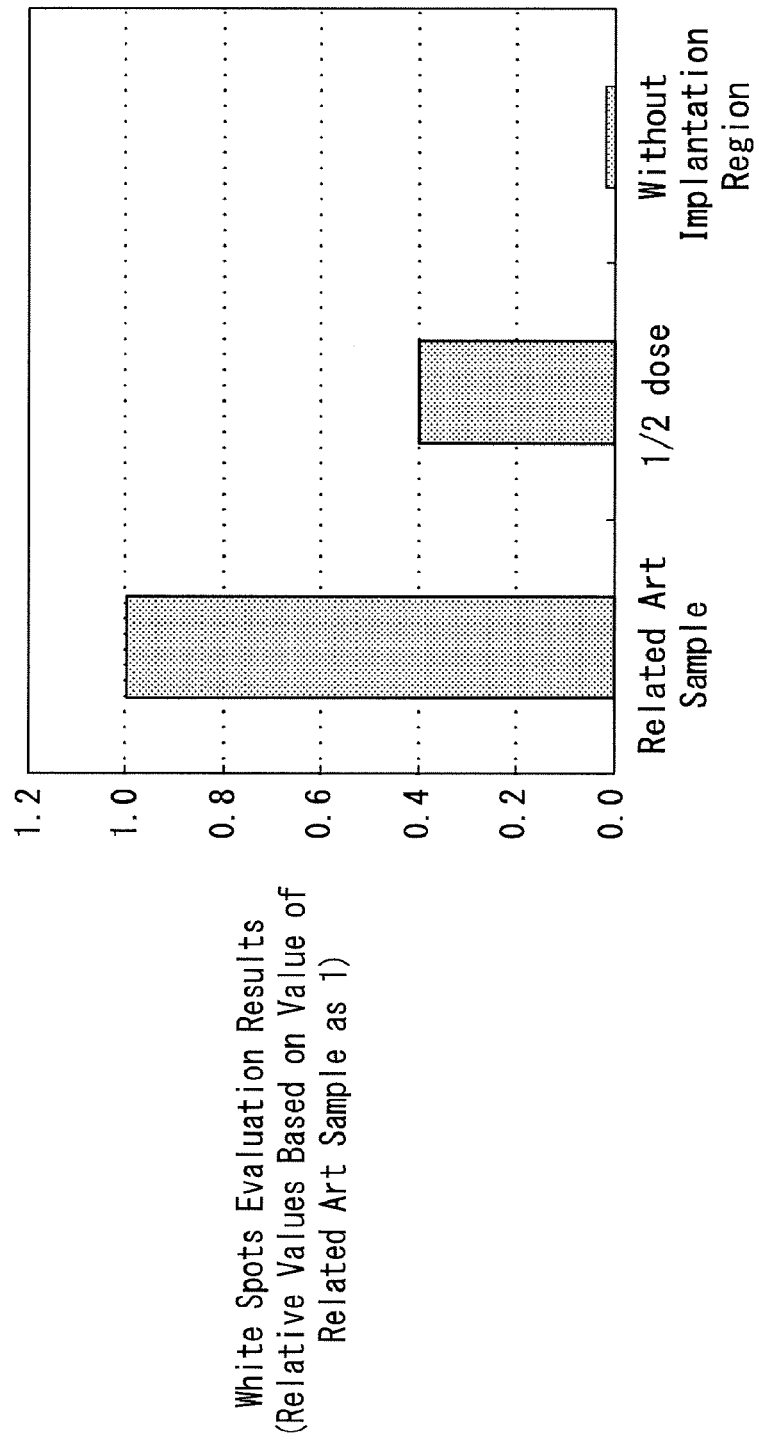
FIG. 24 is a view for describing an example of a solid-state imaging device according to an embodiment of the present invention.

White spots are compared and examined in a solid-state imaging device prepared by a technology of the related art, a first solid-state imaging device of the present example where an impurity concentration in the extension implantation region 25a differs between the pixel 2 and the peripheral circuit 3 (½ dose), and a second solid-state imaging device of the present example where the extension implantation region 25a is not formed. The results are shown in FIG. 24.

This comparative evaluation is performed under conditions where an image is taken with light not incident to a sensor and a pixel of which output is 10 or more of an output in saturation is defined as a white spot. Supply voltage is 3.3 V. FIG. 24 shows the results as relative values based on the number of white spots in the related art sample as 1. As shown in FIG. 24, the number of white spots in the sample where a dose is reduced by ½ based on the related art sample may be reduced by 60% based on the number of white spots in the related art sample, and the number of white spots in the sample where the extension implantation region 25*a* is selectively excluded may be reduced by one digit based on the number of white spots in the related art sample.

As described in the aforementioned embodiment and examples, the solid-state imaging device of the present embodiment may be reduced in size while suppressing a reduction in conversion efficiency due to an increase in volume of a floating diffusion portion and generation of white spots due to electric field concentration, because an impurity concentration in a transistor of pixels is lower than an impurity concentration in a transistor of a peripheral circuit in the solid-state imaging device.

An electronic device formed by the solid-state imaging device of the present embodiment may handle excellent (more accurate, for example) image data.

Materials used and numerical conditions such as amounts of the materials, treatment time, and dimensions referred to in the description of the aforementioned embodiment are only suitable examples, and dimensions, shapes and configurations in the figures used for the description are only schematic. That is, the present invention is not limited to this embodiment.

For example, a solid-state imaging device according to an embodiment of the present invention may be an element formed as one chip, an element formed by a plurality of chips, or an element formed as a module. Various modifications and alterations of the present invention are possible.

It should be understood by those skilled in the art that various modifications, combinations, sub-combinations and alterations may occur depending on design requirements and other factors insofar as they are within the scope of the appended claims or the equivalents thereof.

Description will be made with respect to another embodiment of the present invention referring to FIG. 25.

Figure 25:
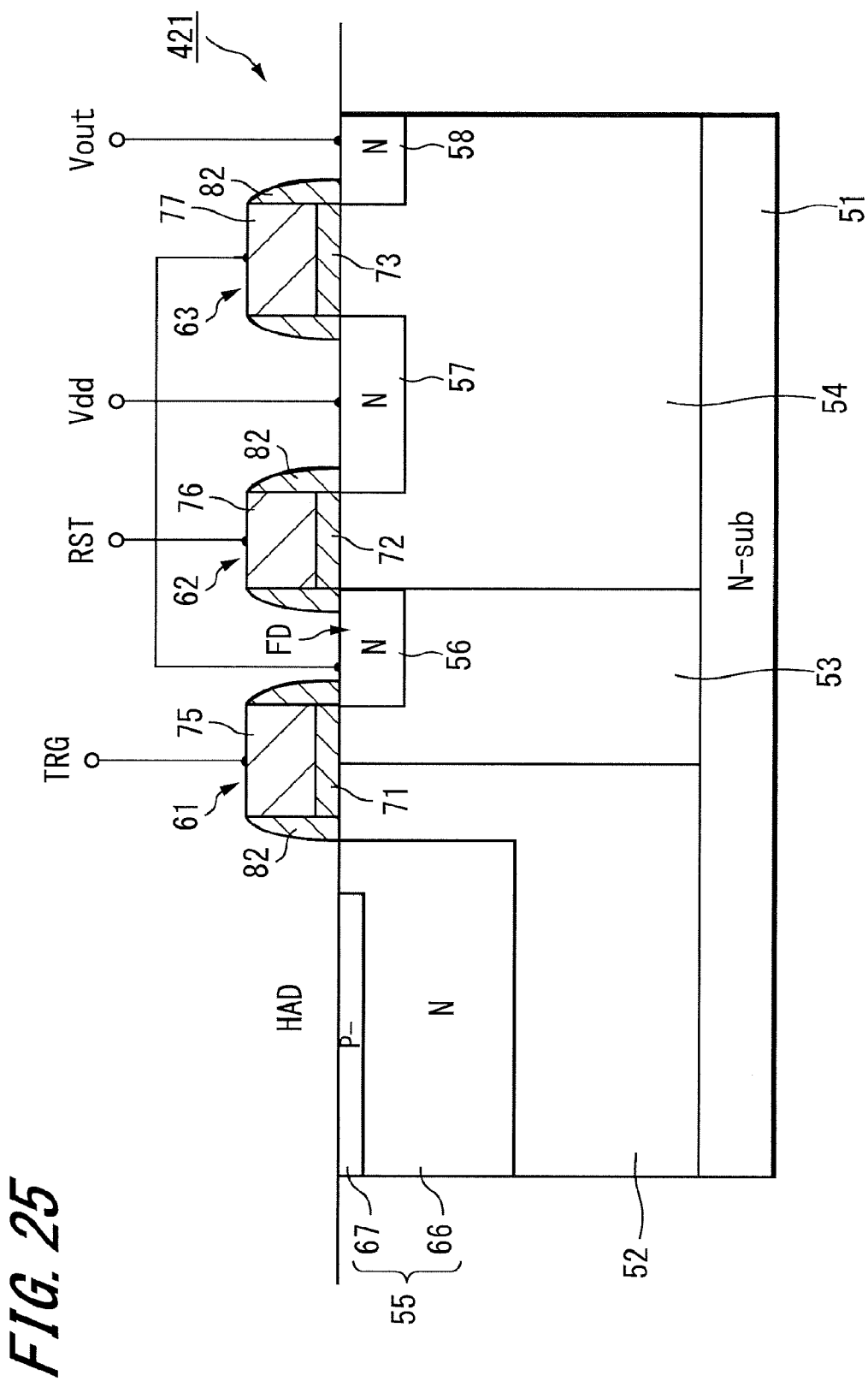
FIG. 25 is a cross section illustrating an example of a pixel portion (imaging region) of the solid-state imaging device according to the present invention.

FIG. 25 illustrates another embodiment of the imaging region in the solid-state imaging device 1 of FIGS. 4A-4C. Note that in FIG. 25, the portion of a unit pixel cell is illustrated. The imaging region in this embodiment, that is, the unit pixel cell is configured by forming a photo-diode (PD) 55, which is the photoelectric conversion portion, in the first-conductivity-type, e.g., the n-type, semiconductor substrate 51, via a first semiconductor well region 52 which is the second-conductive-type such as the p-type, an n-type diffusion region 56 forming the floating diffusion portion FD, via a p-type second semiconductor well region 53, and pixel transistors 62 and 63 at the subsequent stage of the floating diffusion portion FD via a p-type third semiconductor well region 54.

The photo-diode 55 is configured as an HAD sensor including an n-type diffusion region 66 forming a charge accumulation region, and a p-type diffusion region (p-type accumulation layer) 67 for suppressing dark current, provided on the surface of the n-type diffusion region 66.

A transfer transistor 61 is configured by forming a transfer gate electrode 75 between the photo-diode 55 and the n-type diffusion region 56 forming the floating diffusion portion FD, via a gate insulating film 71 formed so as to mount the first and second p-type semiconductor well regions 52 and 53. A reset transistor 62 is configured by forming a reset gate electrode 63 between the n-type diffusion region (FD) 56 and an n-type diffusion region 57 via a gate insulating film 72. An amplifying transistor 63 is configured by forming an amplifying gate electrode 77 between the n-type diffusion region 57 and an n-type diffusion region 58 via a gate insulating film 73.

Further, an insulating sidewall 82 is formed on the gate electrode of each of the pixel transistors 61, 62, and 63. Although omitted in the diagram, there is a case that before forming the sidewall, an LDD (Light Dope Drain) construction having an n-type low-concentration region may be formed.

In addition, in this embodiment, a first, a second, and a third p-type semiconductor well regions 52, 53, and 54 are formed so as to be differentiated in the impurity concentration, and the impurity concentration of the second p-type semiconductor well region 53 in which the n-type diffusion region 56 as the floating diffusion region FD is formed is made lower than the impurity concentration of the third p-type semiconductor well region 54 in which the n-type diffusion regions 57 and 58 of the pixel transistors at the subsequent stage are formed. In this case, the second p-type semiconductor well region 53 is formed such that the impurity concentration of at least the surface side region in which the n-type diffusion semiconductor well region 56 as the floating diffusion portion FD is formed is lower than the impurity concentration of the surface side region in which the n-type diffusion regions 57 and 58 of the third p-type semiconductor well region 54 are formed.

The impurity concentration of the first p-type semiconductor well region 52 in which the photo-diode 55 is formed is made lower than the impurity concentration of the third p-type semiconductor well region 54.

Further, the diffusion region 56 constituting the floating diffusion portion and the diffusion regions 57 and 58 constituting the pixel transistor portion may be formed simultaneously by ion formation in the same impurity concentration. When they are not formed at the same time, the impurity concentration of the diffusion region 56 of the floating diffusion portion is made lower than the impurity concentration of the diffusion regions 57 and 58 of the pixel transistor portion.

Next, using FIG. 26A through FIG. 29, description will be made with respect to the method of producing the solid-state imaging device (in particular, the pixel cell portion thereof) of the present embodiment, which includes the process of separately making the first, the second, and the third semiconductor well regions 52, 53, and 54.

First, as illustrated in FIG. 26A, in the whole surface of the cell region, in which pixel cells are to be formed, of the first-conductive-type semiconductor substrate, for example, the n-type semiconductor substrate 51, that is, in the whole surface of a photo-diode formation region 85, a floating diffusion portion (FD) formation region 86, and a pixel transistor formation region 87 at the subsequent stage of the floating diffusion portion, a first p-type impurity is ion-implanted so as to have a concentration peak in the deep portion thereof to form a first p-type well ion implantation region 91. The impurity concentration distribution of the p-type impurity at the time of this ion implantation is illustrated in FIG. 26B. Next, as illustrated in FIG. 27A, a second p-type impurity having the concentration peak in the intermediary position shallower than the deep portion and deeper than the surface side is ion-implanted to the floating diffusion portion (FD) formation region 86 and the MOS transistor formation region 87 at the subsequent stage, except the photo-diode formation region 85, to form a second p-type well ion implantation region 92. The second p-type well ion implantation region 92 is formed in contact with the first p-type well ion implantation region 91. The concentration distribution of the p-type impurity at the time of this ion implantation is illustrated in FIG. 27B.

Figure 30:
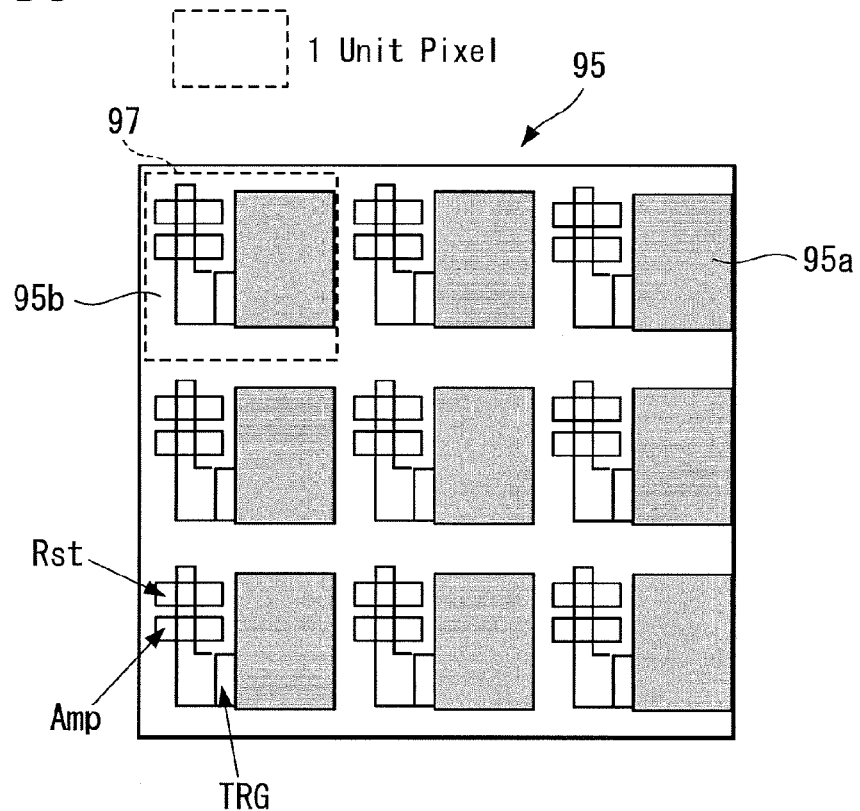
FIG. 30 is a plan view illustrating an ion implantation mask used in the ion implantation process of FIGS. 27A and 27B.

The mask image of an ion implantation mask 95 when forming the second p-type well ion implantation region 92 is illustrated in FIG. 30. A broken line 97 corresponds to one unit pixel cell. A dotted portion 95a corresponds to the photo-diode formation region 85, and an outline portion 95b corresponds to the floating diffusion portion formation region 86 and the pixel transistor formation region 87 at the subsequent stage.

Next, as illustrated in FIG. 28A, by ion implanting a third p-type impurity having the concentration peak on the surface side only to the pixel transistor formation region 87 at the subsequent stage of the cell region of the n-type semiconductor substrate 51, the third p-type well ion implantation region 93 is formed. The third p-type well ion implantation region 93 is formed in contact with the second p-type well ion implantation region 92. The concentration distribution of the third p-type impurity at the time of this ion implantation is illustrated in FIG. 28B.

Figure 31:
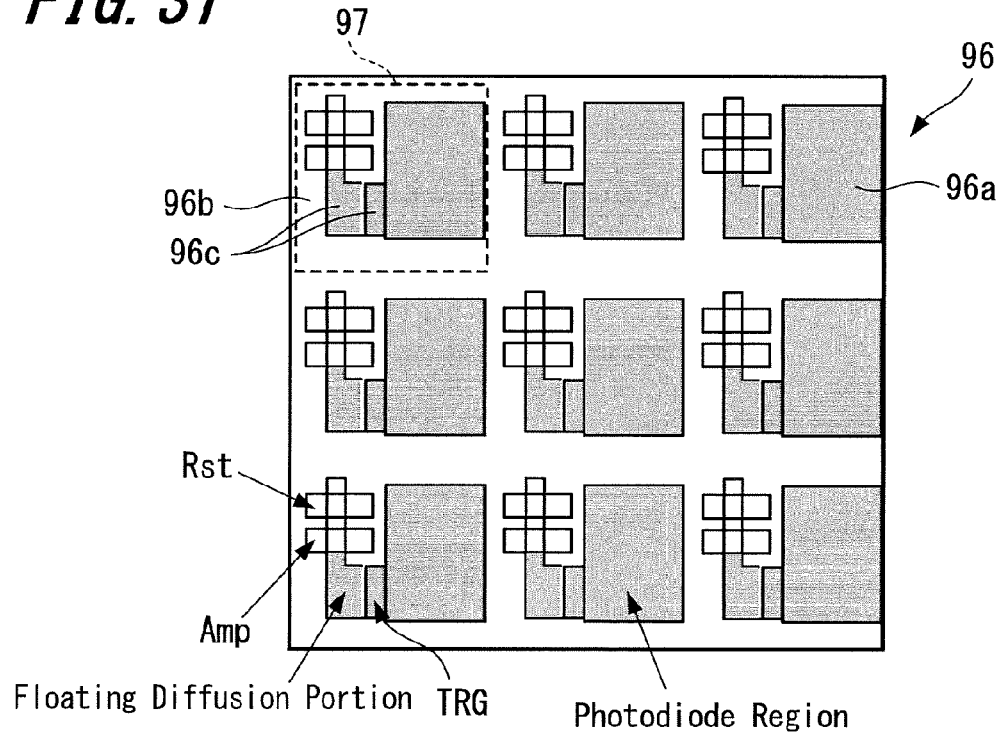
FIG. 31 is a plan view illustrating an ion implantation mask used in the ion implantation process of FIGS. 28A and 28B.

The mask image of an ion implantation mask 96 when forming the third p-type well ion implantation region 93 is illustrated in FIG. 31. A dotted portion 96a corresponds to the photo-diode formation region 85, a dotted portion 96c corresponds to the floating diffusion portion formation region 86, and an outline portion 96b corresponds to the pixel transistor formation region 87 at the subsequent stage.

Figure 29:
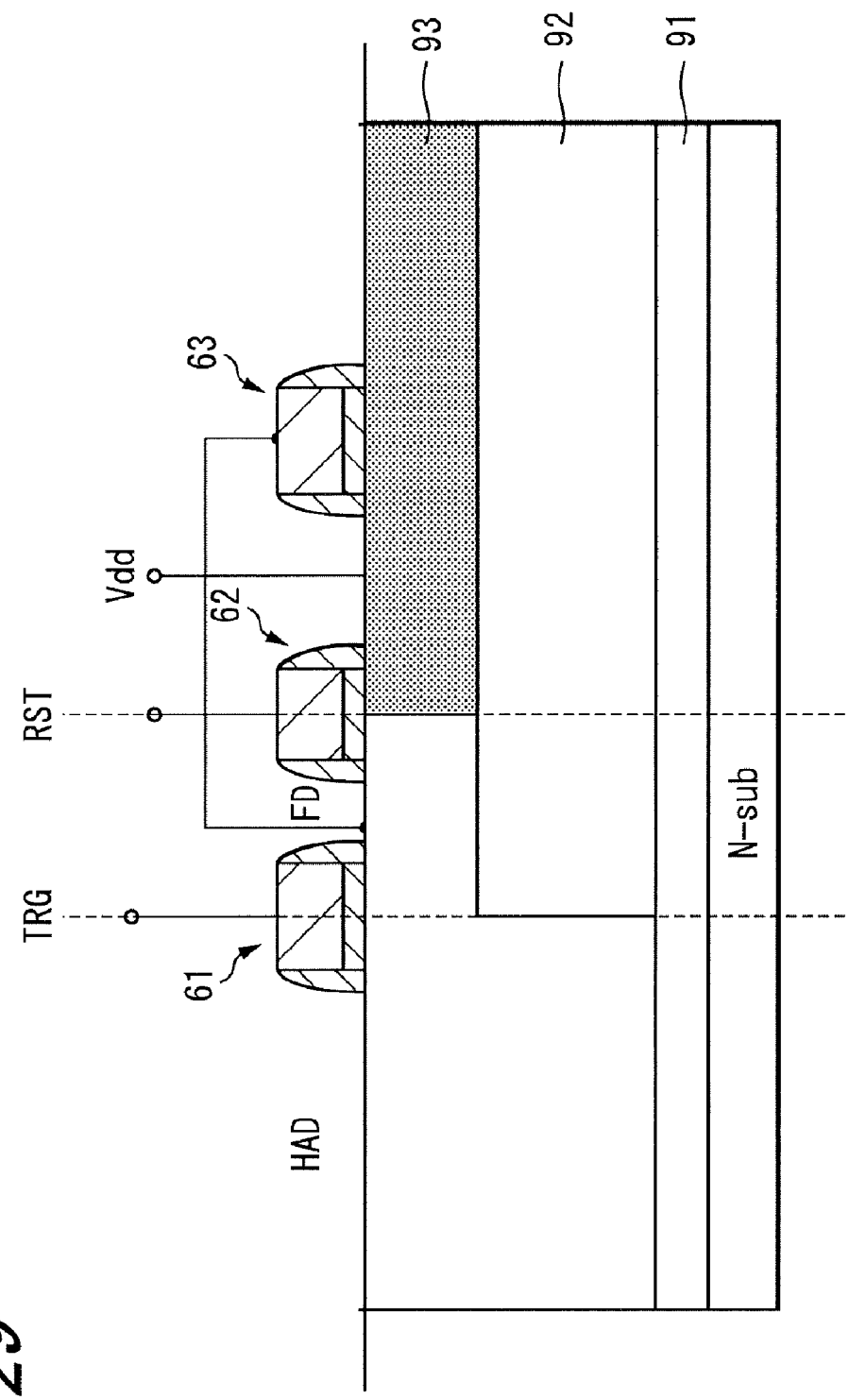
FIG. 29 is the fourth production process diagrams illustrating the embodiment of the method of producing the pixel portion of the solid-state imaging device according to the example of FIG. 25.

Next, as illustrated in FIG. 29, gate electrodes are formed on the n-type semiconductor substrate 51 via gate insulating films, and a low impurity concentration region in the LDD structure is formed using the gate electrodes as the mask and thereby sidewalls are formed.

Thereafter, the photo-diode 55 is formed in the photo-diode formation region 85 by ion implantation. Further, the n-type diffusion region 56 as the floating diffusion portion FD is formed in the floating diffusion region formation region 86, and the n-type diffusion regions 57 and 58 of respective pixel transistors are simultaneously formed by ion implantation in the pixel transistor formation region 87 at the subsequent stage. Furthermore, respective wirings are formed in the wiring formation process. Thus, the solid-state imaging device in which the pixel illustrated in FIG. 25 has been formed is obtained.

Figure 32:
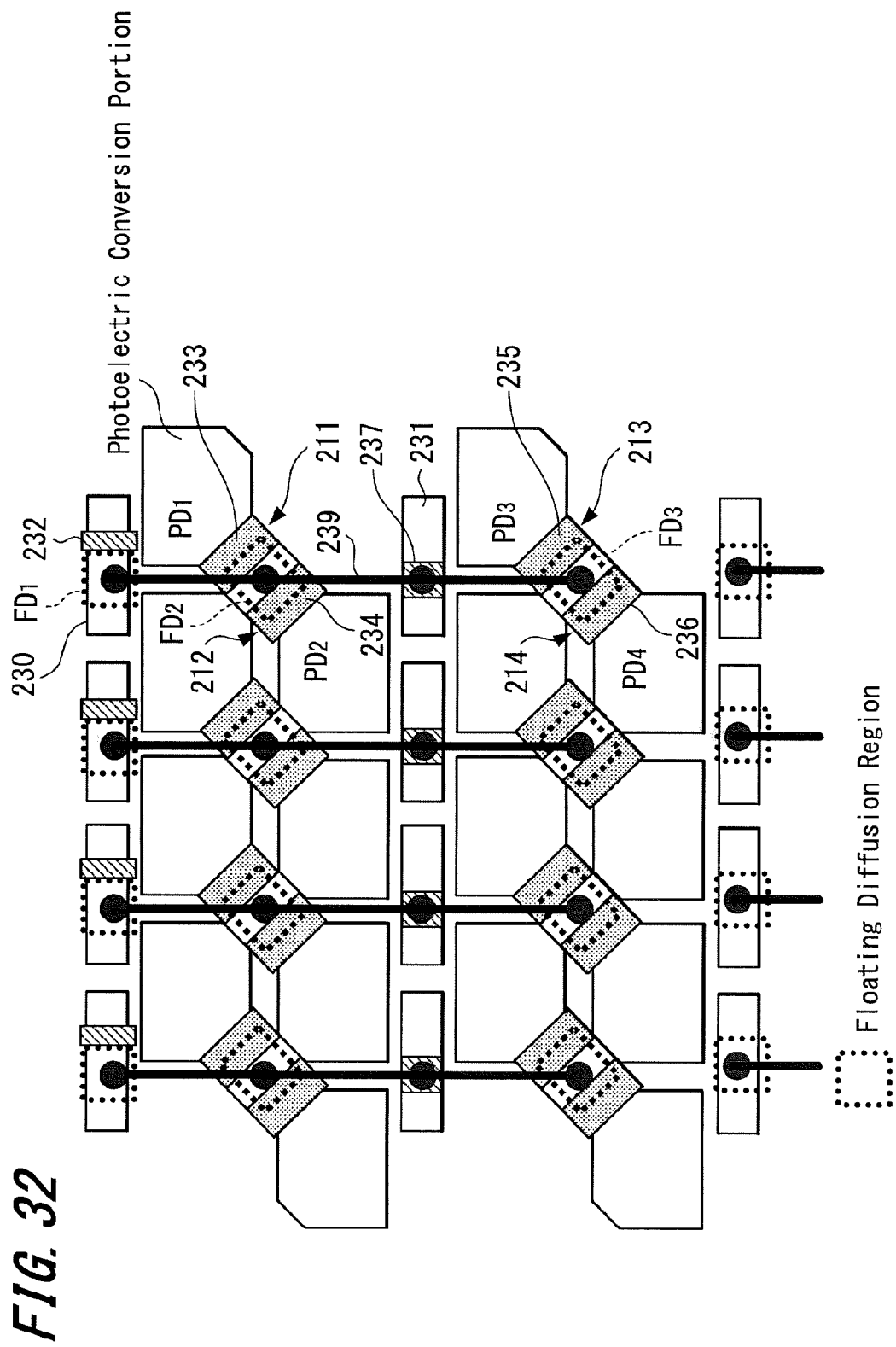
FIG. 32 is a plan view illustrating an example of the pixel portion (imaging region) of the solid-state imaging device according to the present invention.
Figure 33:
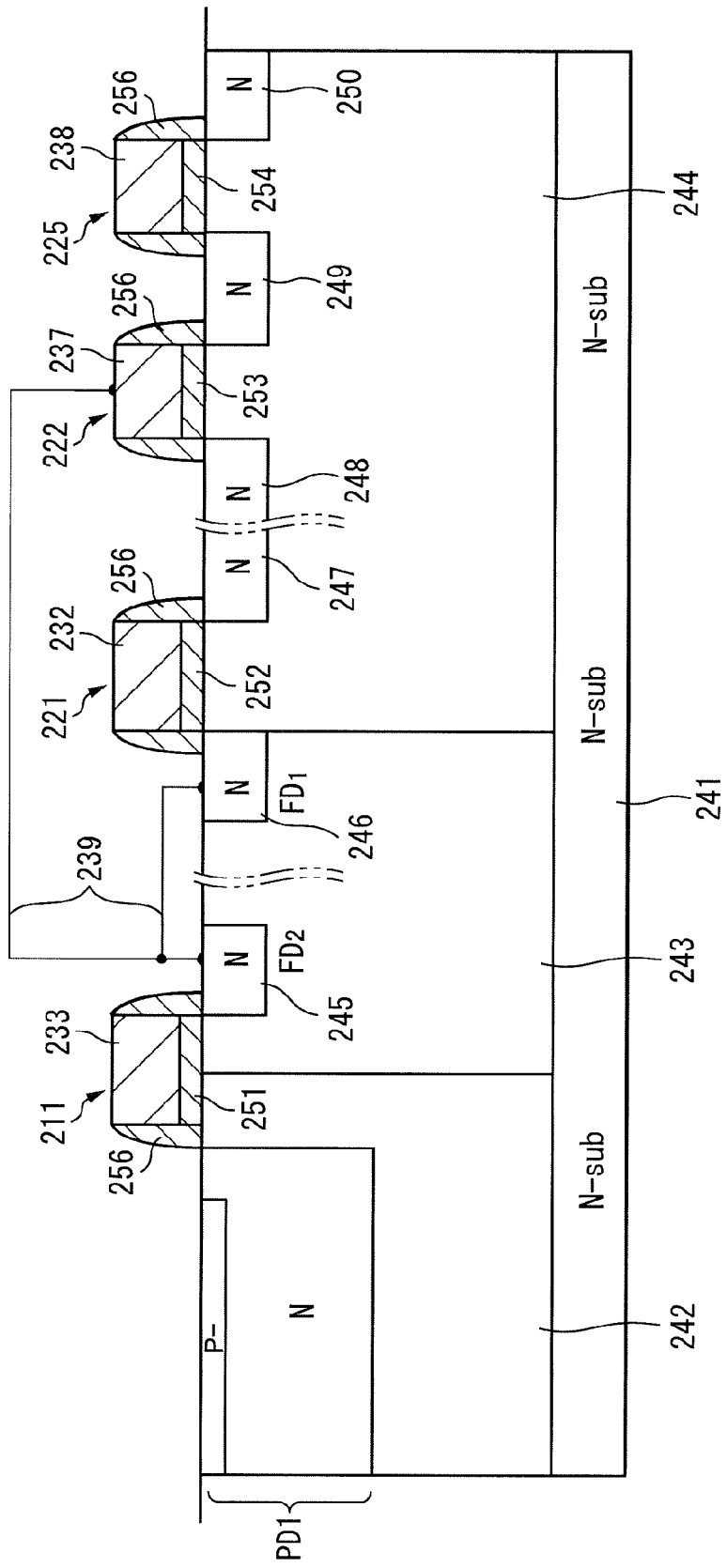
FIG. 33 is a cross section view of a part of a pixel-sharing cell according to the example of FIG. 32.
Figure 34:
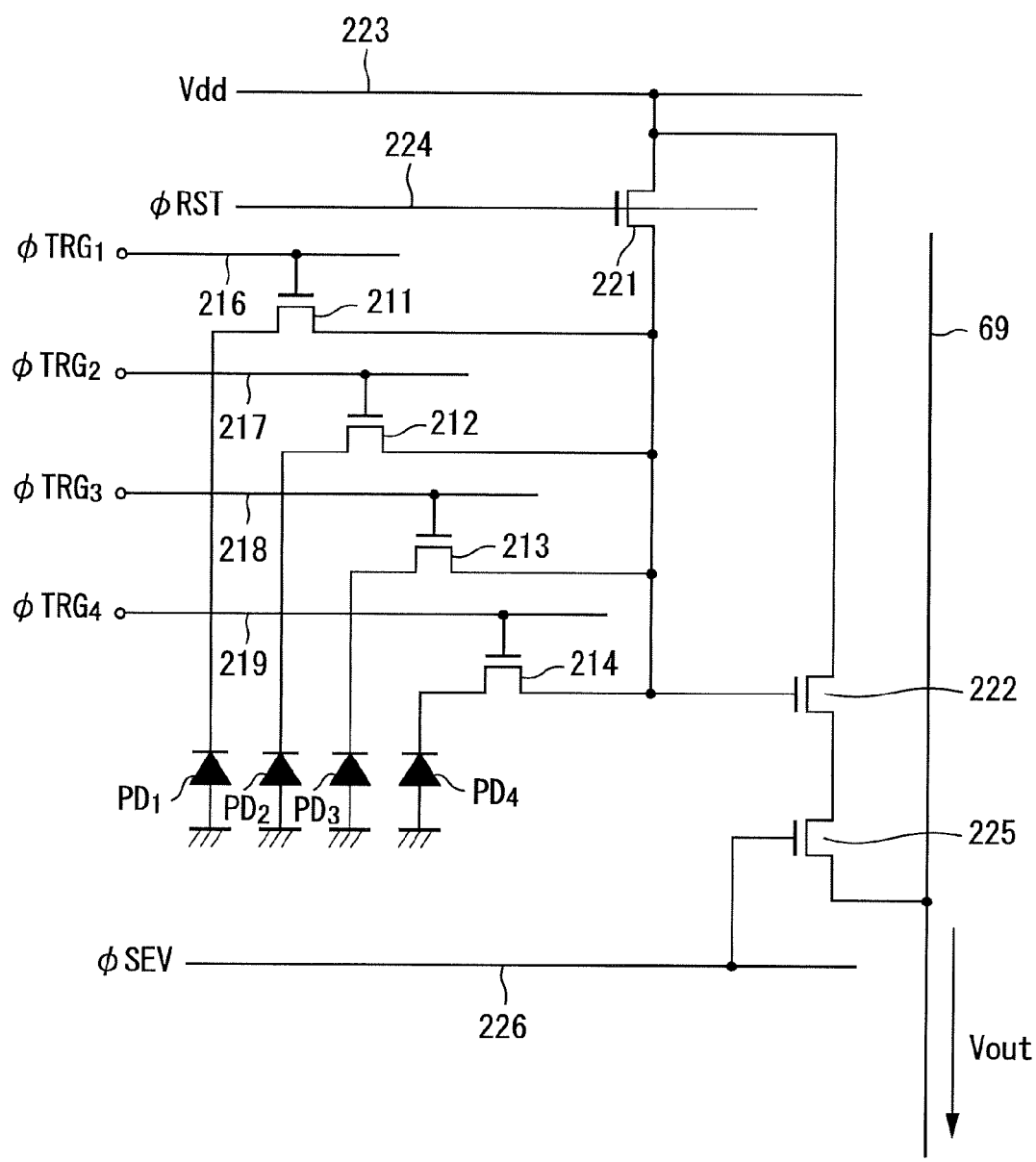
FIG. 34 is an equivalent circuit diagram of the pixel-sharing cell according to the example of FIG. 32.

Next, another embodiment of the imaging region in the above-described solid-state imaging device 1 is illustrated in FIG. 32 through FIG. 34. Note that in FIG. 32 through FIG. 34, the imaging region has the pixel-sharing structure in which a part of the pixel transistors constituting a pixel are shared by a plurality of pixels.

First, using FIG. 34, description will be made with respect to an equivalent circuit of a pixel-sharing cell sharing, for example, 4 pixels. In this example, 4 photo-diodes PD1, PD2, PD3, and PD4 are connected with sources of corresponding transfer transistors 211, 212, 213, and 214. Transfer pulses pTRG1, pTRG2, pTRG3, and pTRG4 are applied to gates of the transfer transistors 211 to 214 via transfer wirings 216, 217, 218, and 219, respectively. Drains of the transfer transistors 211, 212, 213, and 214 are commonly connected with a reset transistor 221, and at the same time, are connected with the gate of an amplifying transistor 222 via the floating diffusion portion FD. The drains of the reset transistor 221 and the amplifying transistor 222 are connected with a pixel power line 223. A reset pulse pRST is applied to the gate of the reset transistor 221 via a reset wiring 224. Further, the source of the amplifying transistor 222 is connected with the drain of a selection transistor 225. The source of the selection transistor 225 is connected with a vertical signal line 69, and a selection pulse φSEL is applied to the gate of the selection transistor 225 via the selection wiring 226.

Further, in this embodiment, as illustrated in FIG. 32, the floating diffusion portion FD is divided into plural portions, in this example into three floating diffusion portions FD1, FD2, and FD3 illustrated in broken lines. The floating diffusion portion FD1 is formed in a transistor occupying region 230 where the reset transistor has been formed. 232 denotes the reset gate. The floating diffusion portion FD2 is formed as the drain common to two transfer transistors 211 and 212 so as to accumulate signal charges of the photo-diodes PD1 and PD2. 233 and 234 denote the transfer gates. The floating diffusion portion FD3 is formed as the drain common to two transfer transistors 213 and 214 so as to accumulate signal charges of the photo-diodes PD3 and PD4. 235 and 236 denote the transfer gates. In a transistor occupying region 231, the amplifying transistor and the selection transistor are formed. The floating diffusion portions FD1, FD2, and FD3 and the gates of the amplifying transistor of the transistor occupying region 231 are connected with each other with a wiring 239.

FIG. 33 illustrates a cross sectional configuration of a part of the pixel-sharing cell of FIG. 32. In FIG. 33, in the first-conductivity-type, for example the n-type, semiconductor substrate 241, the photo-diodes PD1-PD3 as the photoelectrical conversion portion, in figure, the photo-diode PD1 as their representative, is formed via the first second-conductivity-type, i.e., the p-type, semiconductor well region 242, further, n-type diffusion regions 245 and 246, which form the floating diffusion portion FD divided into plural portions, in figure, the floating diffusion portions FD1 and FD2 as their representatives, are formed via the p-type second semiconductor well region 243, and further, via the p-type third semiconductor well region 244, the reset transistor 221, the amplifying transistor 222, and the selection transistor 225 are formed.

The transfer transistors 211 to 214, in figure, the transfer transistor 211 as their representative, is configured by forming the transfer gate electrode 233 between the photo-diode PD1 and an n-type diffusion region 245 forming the floating diffusion portion FD2, via a gate insulating film 251 which is formed so as to mount on the first and the second p-type semiconductor well regions 242 and 243. The reset transistor 221 is configured by forming the reset gate electrode 232 between an n-type diffusion region 246 forming the floating diffusion portion FD1 and an n-type diffusion region 247 via a gate insulating film 252. The amplifying transistor 222 is configured by forming the amplifying gate electrode 237 between an n-type diffusion region 248 and an n-type diffusion region 249 via a gate insulting film 253. The selection transistor 225 is configured by forming the selection gate electrode 238 between the n-type diffusion region 249 and an n-type diffusion region 250 via a gate insulting film 254. The floating diffusion portions FD1 and FD2 and the amplification gate electrode 237 are connected with each other with the wiring 239. Further, for reducing the electric field between the diffusion region and the edge of the well, that is, for reducing the electric field in the p-n junction in the source/drain region, and for maintaining the response speed, the LDD structure may be formed before forming a sidewall.

Additionally, in this embodiment, the first, the second and the third p-type semiconductor well regions 242, 243 and 244 are separately made so as to be different from each other in the impurity concentration, and the impurity concentration of the second p-type semiconductor well region 243 in which the n-type diffusion regions 245 and 246 as the floating diffusion portions FD2 and FD1 are formed is made lower than the impurity concentration of the third p-type semiconductor well region 244 in which the n-type diffusion regions 247 to 250 of respective transistors at the subsequent stage are formed. In this case, the second n-type semiconductor well region 243 is formed such that the impurity concentration of at least the surface side region in which the n-type diffusion regions 245 and 246 as the floating diffusion portions FD2 and FD1 are formed is lower than the impurity concentration of the surface side region of the third p-type semiconductor well region where the n-type diffusion regions 247 to 250 are formed.

The impurity concentration of the first p-type semiconductor well region 242 where the photo-diode PD1 is formed is made lower than the impurity concentration of the third p-type semiconductor well region 244.

The floating diffusion portions FD1-FD3, in figure, the diffusion regions constituting 245 and 246 and the diffusion regions 247 to 250 constituting the pixel transistor portion, may be simultaneously ion formed in the same impurity concentration, and when they are not formed at the same time, they are formed with the impurity concentration of the diffusion region of the floating diffusion portion made lower than the impurity concentration of the diffusion region of the pixel transistor portion.

The production of the solid-state imaging device in the another embodiment described immediately above, in particular the production of the pixel-sharing cell, may be performed in the same manner as described above with reference to FIG. 26A-FIG. 29.

According to the above-described another embodiment, in the pixel cell having the divided floating diffusion portions FD1-FD3, the impurity concentration of the second p-type semiconductor well region 243 in which the floating diffusion portions FD1-FD3 have been formed, at least the impurity concentration of the surface side where the floating diffusion portions FD have been formed is made lower than the impurity concentration of the third p-type semiconductor region 244 where the pixel transistors at the subsequent stage have been formed. By making the impurity concentration of the second p-type semiconductor well region 242 lower, the parasitic capacitance in the floating diffusion portions FD1-FD3 decreases and the conversion efficiency of the pixel can be enhanced. Thereby, it is possible to efficiently perform voltage conversion of the photo-electrically converted charge.

In the above-described another embodiment, the impurity concentration of the p-type semiconductor well region where the whole of the plural floating diffusion portions are formed is made relatively low, however, by configuring such that among the plural floating diffusion portions, only the p-type semiconductor well region under predetermined floating diffusion portions is formed in a low impurity concentration, the conversion efficiency of the pixel can be enhanced and the voltage conversion of the photo-electrically converted charge can be efficiently performed.

In the above-described another embodiment, because as the charge, the mobility of electrons is larger than that of holes, it has been configured such that semiconductor well regions are formed with the p-type, photo-diodes and floating diffusion portions are formed with the n-type, and nMOS transistors are used, however, it may be configured to use holes as the charges. When the holes are used, the p-type diffusion layer (source/drain region) forming a MOS transistor is formed in the n-type semiconductor well region.

What is claimed is:

1. A method of producing a solid-state imaging device, comprising the steps of:

forming in a cell region in which a unit pixel cell or pixel-sharing cell of a first-conductivity-type semiconductor substrate is to be formed, a first second-conductivity-type semiconductor well region of a photoelectric conversion portion formation region, a second second-conductivity-type semiconductor well region of a floating diffusion portion formation region, and a third second-conductivity-type semiconductor well region of a pixel transistor portion formation region, wherein an impurity concentration of the second second-conductivity-type semiconductor well region is made lower than an impurity concentration of the third second-conductivity-type semiconductor well region;

forming a photoelectric conversion portion in the first second-conductivity-type semiconductor well region;

forming a floating diffusion portion in the second second-conductivity-type semiconductor well region, and a first-conductivity-type diffusion region of a pixel transistor portion at the subsequent stage of the floating diffusion portion in the third second-conductivity-type semiconductor well region;

ion implanting a first second-conductivity-type impurity having a concentration peak in a deep part to a whole surface of the cell region;

ion implanting a second second-conductivity-type impurity having a concentration peak in an intermediate part between the deep part and the surface side to a floating diffusion portion formation region and a pixel transistor formation region at the subsequent stage of the floating diffusion portion except the photoelectric conversion portion formation region of the cell region; and ion implanting a third second-conductivity-type impurity having a concentration peak at the surface side only to the pixel transistor portion formation region of the cell region, wherein the first second-conductivity-type semiconductor well region is formed in the photoelectric conversion portion formation region, the third second-conductivity-type semiconductor well region is formed in the pixel transistor portion formation region, and the second second-conductivity-type semiconductor well region in the impurity concentration lower than the impurity concentration of the third second-conductivity-type semiconductor well region is formed in the floating diffusion portion formation region.

2. A method of producing a solid-state imaging device according to claim 1, wherein the first-conductivity-type diffusion region of the floating diffusion portion and the first-conductivity-type diffusion region of the pixel transistor portion are formed at a same time in a same impurity concentration.

3. A method of producing a solid-state imaging device according to claim 1, wherein the first-conductivity-type diffusion region of the floating diffusion portion is formed in an impurity concentration lower than an impurity concentration of the first-conductivity-type diffusion region of the pixel transistor portion.

* * * * *